United States Patent
Sudo et al.

(10) Patent No.: US 9,130,526 B2
(45) Date of Patent: *Sep. 8, 2015

(54) SIGNAL PROCESSING APPARATUS

(71) Applicant: KABUSHIKI KAISHA TOSHIBA, Minato-ku, Tokyo (JP)

(72) Inventors: Takashi Sudo, Fuchu (JP); Masataka Osada, Kawasaki (JP)

(73) Assignee: KABUSHIIKI KAISHA TOSHIBA, Tokyo (JP)

( * ) Notice: Subject to any disclaimer, the term of this patent is extended or adjusted under 35 U.S.C. 154(b) by 337 days.

This patent is subject to a terminal disclaimer.

(21) Appl. No.: 13/677,910

(22) Filed: Nov. 15, 2012

(65) Prior Publication Data

US 2013/0070939 A1 Mar. 21, 2013

Related U.S. Application Data

(62) Division of application No. 12/559,843, filed on Sep. 15, 2009, now Pat. No. 8,515,085.

(30) Foreign Application Priority Data

Mar. 24, 2009 (JP) ................................. 2009-072886

(51) Int. Cl.
H03G 3/20 (2006.01)
H03G 3/32 (2006.01)
(Continued)

(52) U.S. Cl.
CPC . *H03G 3/20* (2013.01); *H03G 3/32* (2013.01); *H03G 9/005* (2013.01); *H03G 9/18* (2013.01)

(58) Field of Classification Search
CPC ........... H03G 3/32; H03G 9/005; H03G 3/20; H03G 9/18
USPC .............. 381/57, 56, 94.1, 98, 102, 103, 104, 381/107
See application file for complete search history.

(56) References Cited

U.S. PATENT DOCUMENTS 6,694,018 B1 2/2004 Omori
7,065,206 B2 6/2006 Pan
(Continued)

FOREIGN PATENT DOCUMENTS

JP 06-289900 A 10/1994
JP 07-111527 A 4/1995
(Continued)

OTHER PUBLICATIONS

Japanese Office Action dated Aug. 2, 2011 (and English translation thereof) in counterpart Japanese Application No. 2009-072886.
(Continued)

*Primary Examiner* — Paul S Kim
(74) *Attorney, Agent, or Firm* — Holtz, Holtz, Goodman & Chick PC

(57) ABSTRACT

A signal processing apparatus is configured to change volume level or frequency characteristics of an input signal with a limited bandwidth in a first frequency range. The apparatus includes: an information extracting unit configured to extract second frequency characteristic information from a collection signal with a limited bandwidth in a second frequency range different from the first frequency range; a frequency characteristic information extending unit configured to estimate first frequency characteristic information from the second frequency characteristic information extracted by the information extracting unit, the first frequency characteristic information including the first frequency range; and a signal correcting unit configured to change volume level or frequency characteristics of the input signal according to the first frequency characteristic information obtained by the frequency characteristic information extending unit.

9 Claims, 24 Drawing Sheets

(51) Int. Cl.
*H03G 9/00* (2006.01)
*H03G 9/18* (2006.01)

(56) References Cited

U.S. PATENT DOCUMENTS 7,711,557 B2 5/2010 Ozawa
8,265,301 B2 9/2012 Kimijima et al.

FOREIGN PATENT DOCUMENTS

| JP | 08-065531 A | 3/1996 |
|---|---|---|
| JP | 2000-148161 A | 5/2000 |
| JP | 2000-200099 A | 7/2000 |
| JP | 2001-188599 A | 7/2001 |
| JP | 2001188599 A * | 7/2001 |
| JP | 2001-208609 A | 8/2001 |
| JP | 2004-289614 A | 10/2004 |
| JP | 2006-229766 A | 8/2006 |
| JP | 2007-067858 A | 3/2007 |
| JP | 2007-150737 A | 6/2007 |
| JP | 2007-518291 A | 7/2007 |
| WO | WO 2005/053277 A2 | 6/2005 |

OTHER PUBLICATIONS

Japanese Office Action dated Nov. 29, 2011 (and English translation thereof) in counterpart Japanese Application No. 2009-072886.
Japanese Office Action dated Mar. 12, 2013 (and English translation thereof) issued in counterpart Japanese Application No. 2012-144135.

* cited by examiner

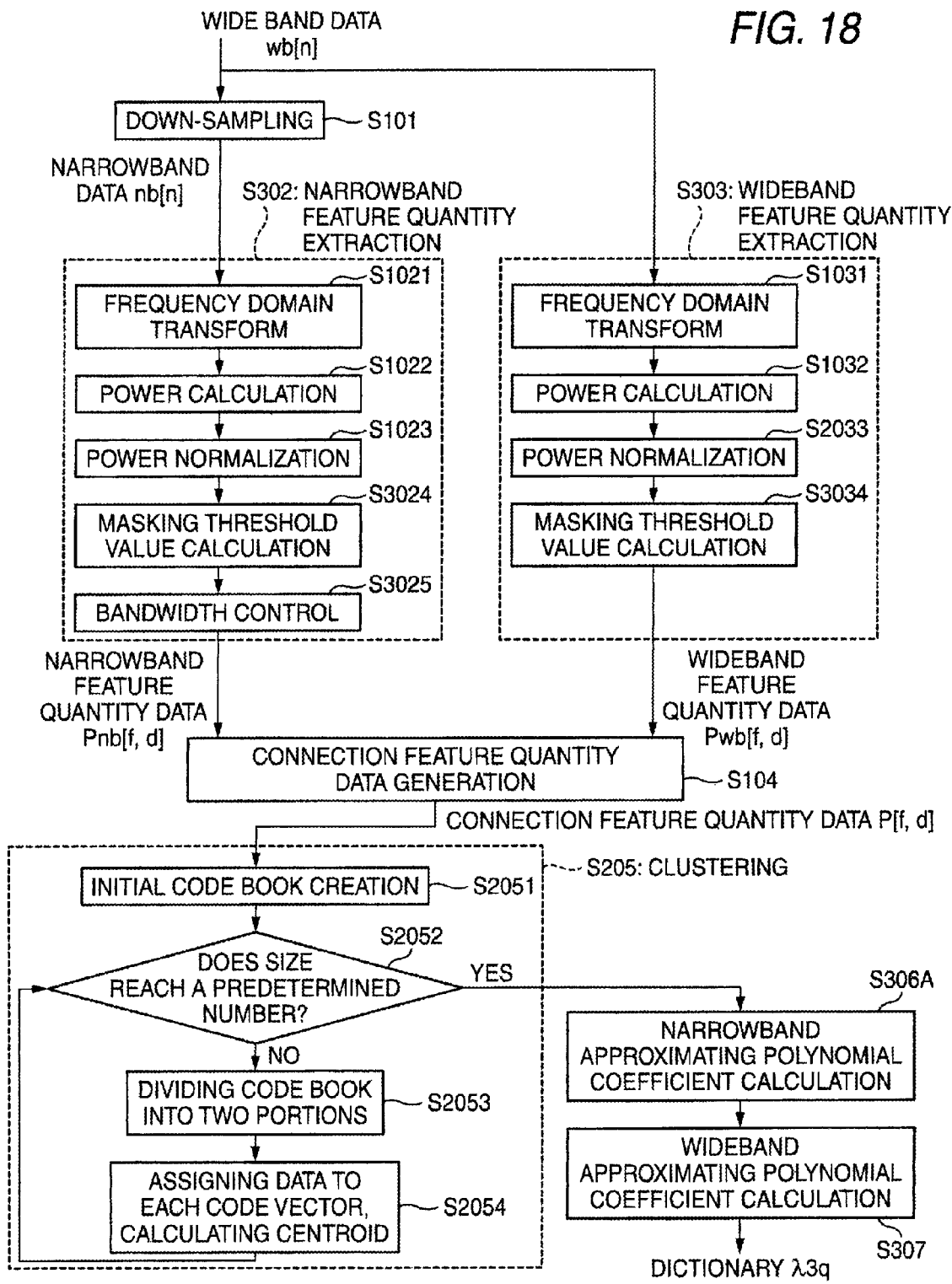

SIGNAL PROCESSING APPARATUS

CROSS-REFERENCE TO RELATED APPLICATIONS

The entire disclosure of Japanese Patent Application No. 2009-072886 filed on Mar. 24, 2009, including specification, claims, drawings and abstract is incorporated herein by reference in its entirety.

BACKGROUND

1. Field of the Invention

One aspect of the present invention relates to a signal processing apparatus in which the intelligibility of a signal, such as speech, music, or audio, is improved.

2. Description of the Related Art

When a signal, such as speech, music, or audio, is reproduced, due to the influence of ambient noises other than a predetermined sound (hereinafter, referred to as a target signal), such as speech, music, or audio, the intelligibility of the target signal may be degraded. In order to improve the intelligibility of the target signal, there is a need to perform a signal process according to the ambient noise that is included in the collection signal. In the past, as such a signal processing method, there is disclosed a scheme using the volume level of the ambient noise and a scheme using the frequency characteristics of the ambient noise (s ee JP-A-2001-188599, for instance).

However, since the target signal and the ambient noise are different from each other in the limited frequency band, the frequency bands in which signal components exist may be different from each other or sampling frequencies may be different from each other. In these cases, since the volume level or the frequency characteristics of the ambient noise is not obtained with high accuracy by the related signal processing apparatuses, there is a problem that there is degradation in sound quality and the intelligibility cannot be improved.

In addition, even though the bandwidth of the collected ambient noise is extended using the related technique in which the bandwidth of the target signal, such as speech signals, or music and audio signals, is extended using aliasing, a non-linear function, or linear prediction analysis, there is a problem that the frequency characteristics of the ambient noise cannot be estimated with high accuracy.

SUMMARY

According to an aspect of the invention, there is provided a signal processing apparatus configured to change volume level or frequency characteristics of an input signal with a limited bandwidth in a first frequency range, the apparatus including: an information extracting unit configured to extract second frequency characteristic information from a collection signal with a limited bandwidth in a second frequency range different from the first frequency range; a frequency characteristic information extending unit configured to estimate first frequency characteristic information from the second frequency characteristic information extracted by the information extracting unit, the first frequency characteristic information including the first frequency range; and a signal correcting unit configured to change volume level or frequency characteristics of the input signal according to the first frequency characteristic information obtained by the frequency characteristic information extending unit.

BRIEF DESCRIPTION OF THE DRAWINGS

Embodiment may be described in detail with reference to the accompanying drawings, in which:

FIG. 18 is a flowchart illustrating still another method of generating a dictionary in the dictionary memory of the ambient noise information bandwidth extending unit shown in FIG. 14;

DETAILED DESCRIPTION OF THE EMBODIMENTS

In the following, exemplary embodiments of the invention will be described with reference to the accompanying drawings.

First Embodiment

Figure 1:
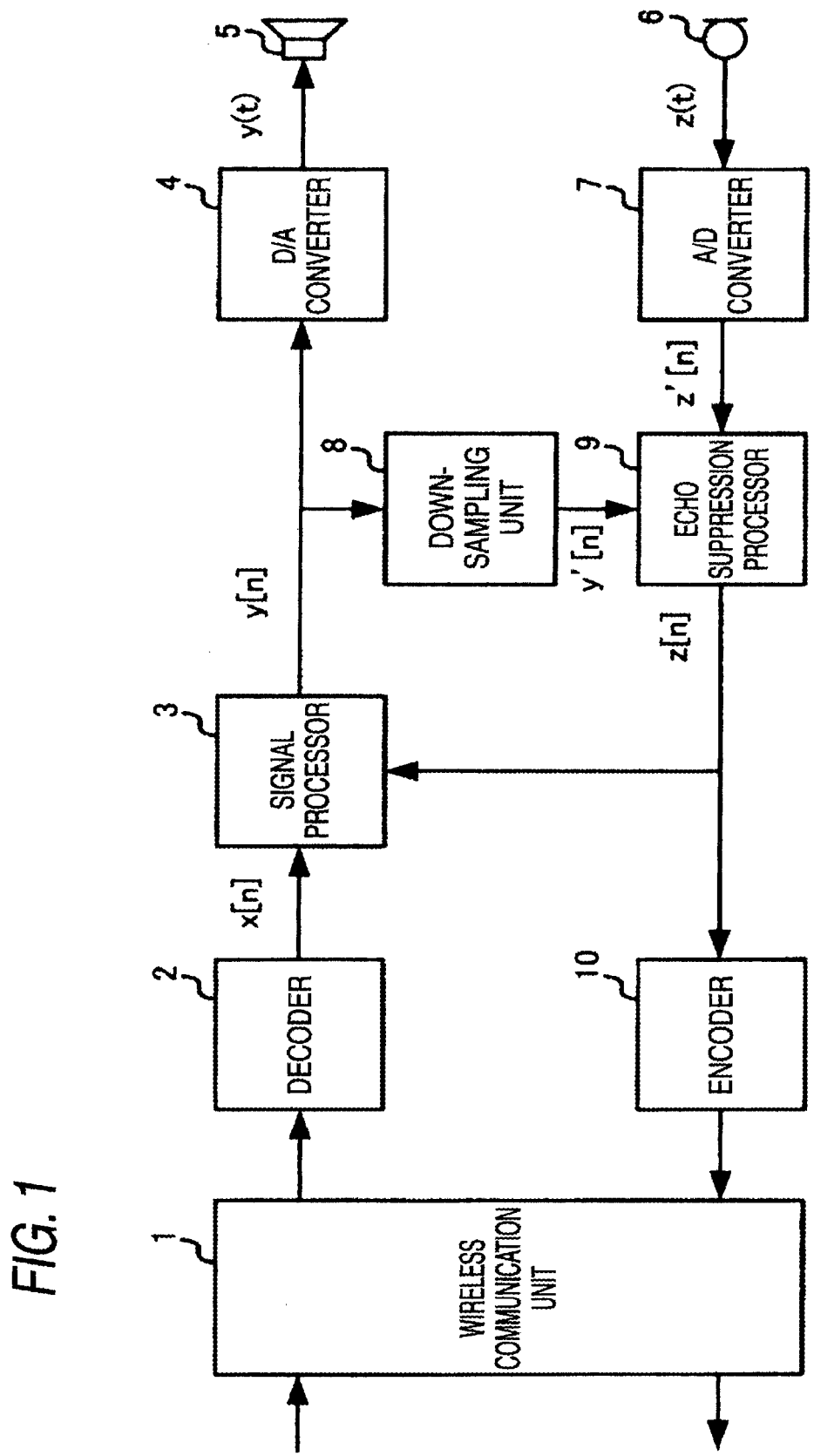
FIG. 1 is an exemplary circuit block diagram illustrating a communication apparatus to which a signal processing apparatus according to a first embodiment of the invention is applied.

FIG. 1 shows a configuration of a communication apparatus according to a first embodiment of the invention. The communication apparatus shown in the drawing shows a reception system of a wireless communication apparatus such as a mobile telephone, which is provided with a wireless communication unit 1, a decoder 2, a signal processor 3, a digital/analog (D/A) converter 4, a speaker 5, a microphone 6, an analog/digital (A/D) converter 7, a down-sampling unit 8, an echo suppression processor 9, and an encoder 10. In this embodiment, the target signal to be reproduced will be described as a speech signal which is included in the received input signal from a far end speaker.

The wireless communication unit 1 performs wireless communication with a wireless base station which is accommodated in a mobile communication network, and communicates with a counterpart communication apparatus by establishing a communication link therewith via the mobile communication network.

The decoder 2 decodes input data that the wireless communication unit 1 receives from the counterpart communication apparatus in each single frame which is set in advance to a predetermined time unit (=20 [ms]), obtains digital input signals $x[n]$ ($n=0, 1, \ldots, N-1$) to be output to the signal processor 3 in frame units. In this case, the input signals $x[n]$ are signals in a wideband in which a sampling frequency is fs' [Hz] and which has limited bandwidth ranging from fs_wb_low [Hz] to fs_wb_high [Hz]. Here, the relationship between the sampling frequency of the input signal and the sampling frequency fs [Hz] of the collection signal $z[n]$ to be described later is assumed to satisfy fs'=2fs. In addition, the data length of one frame at the sampling frequency fs' [Hz] is set to 2N samples. That is, N is assumed to be set to 20 [ms]×fs [Hz]÷1000.

The signal processor 3 performs a signal correcting process on the input signal $x[n]$ ($n=0, 1, \ldots, 2N-1$) in frame units according to the collection signal $z[n]$ ($n=0, 1, \ldots, N-1$) in which echo components are reduced by an echo suppression processor 8 to be described later, changes volume level or frequency characteristics, and outputs the output signal $y[n]$ ($n=0, 1, \ldots, 2N-1$) to the D/A converter 4 and the down-sampling unit 8. Further, the exemplary configuration of the signal processor 3 will be described in detail later.

The D/A converter 4 converts the corrected output signal $y[n]$ into an analog signal $y(t)$, and outputs the analog signal $y(t)$ to the speaker 5. The speaker outputs the output signal $y(t)$ which is the analog signal to an acoustic space.

The microphone 6 collects sounds and obtains the collection signal $z(t)$ which is the analog signal, and outputs the collection signal to the A/D converter 7. In the analog signal, there is a mixture of the speech signal from a near end speaker, noise components from the ambient environment other than the speech signal, echo components caused by the output signal $y(t)$ and the acoustic space, and the like. For example, as examples of the noise component, there may be noises output from trains, car noises output from vehicles, street noises output from a crowd, and the like. In this embodiment, since the speech signal of the near end speaker is the required signal when the communication apparatus performs communication with a counterpart communication apparatus, the components other than the speech signal of the near end speaker are treated as ambient noises.

The A/D converter 7 converts the collection signal $z(t)$ which is the analog signal into a digital signal, and obtains the digital collection signal $z'[n]$ ($n=0, 1, \ldots, N-1$) to be output to the echo suppression processor 8 in N sample units. In this case, the collection signal $z[n]$ is signal in a narrowband in which a sampling frequency is fs [Hz] and which has limited bandwidth ranging from fs_nb_low [Hz] to fs_nb_high [Hz]. In addition, fs_wb_low≤fs_nb_low<fs_nb_high<fs/2≤fs_wb_high<fs'/2 is satisfied.

The down-sampling unit 8 down-samples the output signal $y[n]$ from the sampling frequency fs' [Hz] to the sampling frequency fs [Hz], and outputs the signal $y'[n]$ ($n=0, 1, \ldots, N-1$), which has limited bandwidth ranging from fs_nb_low [Hz] to fs_nb_high [Hz], to the echo suppression processor 9.

The echo suppression processor 9 performs a process for reducing the echo components included in the collection signal $z'[n]$ ($n=0, 1, \ldots, N-1$) by using the down-sampled output signal $y'[n]$, and outputs the signal $z[n]$ ($n=0, 1, \ldots, N-1$), in which the echo components is reduced, to the signal processor 3 and the encoder 10. Here, for example, the echo suppression processor 9 may be implemented by the existing techniques which are described in Japanese Patent No. 4047867, JP-A-2006-203358, JP-A-2007-60644, or the like.

The encoder 10 encodes the collection signal $z[n]$ ($n=0, 1, \ldots, N-1$), in which the echo components in each N samples are reduced by the echo suppression processor 8, and outputs the encoded signal to the wireless communication unit 1 which transmits that signal as the transmission data to the counterpart communication apparatus.

Next, the signal processor 3 according to an embodiment will be described. In the following descriptions, for example, it is assumed that fs=8000 [Hz], fs'=16000 [Hz], fs_nb_low=340 [Hz], fs_nb_high=3950 [Hz], fs_wb_low=50 [Hz], and fs_wb_high=7950 [Hz]. The frequencies with limited bandwidth or the sampling frequency are not limited to the setting values described above. In addition, N is assumed to be set to 160.

Figure 2:
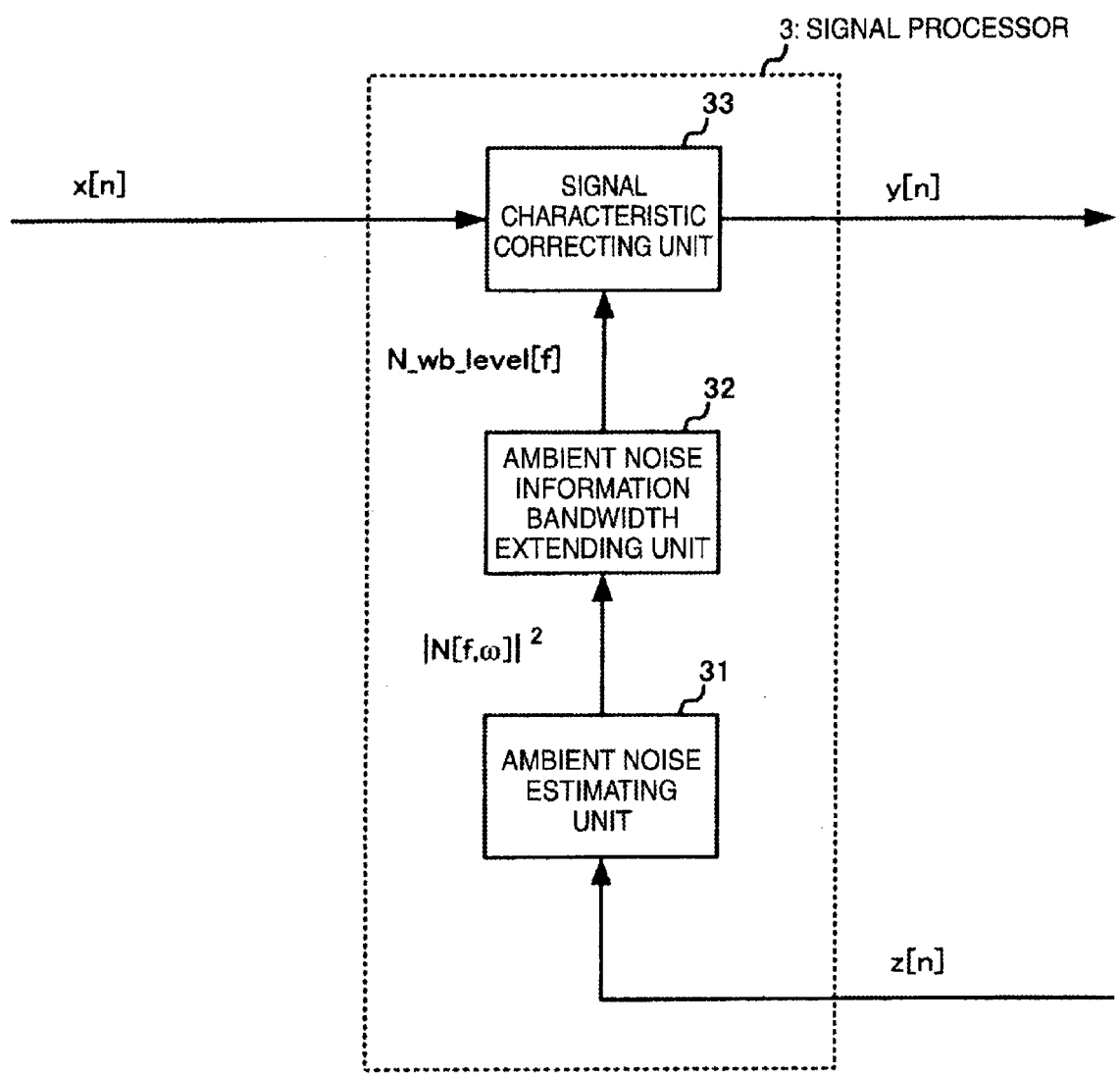
FIG. 2 is an exemplary circuit block diagram illustrating a signal processor according to the first embodiment of the invention.

FIG. 2 shows an exemplary configuration of the signal processor 3. The signal processor 3 is provided with an ambient noise estimating unit 31, an ambient noise information bandwidth extending unit 32, and a signal characteristic correcting unit 33. These units may be implemented by one processor and software which is recorded in a storage medium (not shown).

The ambient noise estimating unit 31 estimates the signals, as the ambient noise, other than the speech signal of the near end speaker in which the echo components are reduced by the echo suppression processor 8, and extracts a feature quantity which characterizes the ambient noise. Further, since the collection signal $z[n]$ is a signal in the narrowband, the ambient noise is also a signal in the narrowband. Here, the feature quantity characterizing the ambient noise is called narrowband signal information. The narrowband signal information may be any information as long as the information characterizes the ambient noise, such as a power spectrum, an amplitude spectrum or a phase spectrum, the PARCOR coefficient (partial auto-correlation coefficient) or the reflection coefficient, a line spectral frequency, the cepstral coefficient, the mel frequency cepstral coefficient.

The ambient noise information bandwidth extending unit 32 estimates the feature quantity characterizing the ambient noise using the narrowband signal information when the ambient noise is extended to the frequency band (wideband) equal to the frequency band of the input signal x[n]. The feature quantity is called wideband signal information.

The signal characteristic correcting unit 33 corrects the signal characteristics of the target signal using the ambient noise information bandwidth extending unit 32.

As described above, even though the ambient noise is a signal in the narrowband, when the ambient noise is extended to the wideband and the feature quantity thereof is estimated, the intelligibility of the target signal can be improved through the correction process performed by the signal characteristic correcting unit 33.

In the following descriptions, the configuration of the signal processor 3 will be described in detail. Further, the following descriptions will be made assuming that the narrowband signal information is a power spectrum of the ambient noise, and the wideband signal information is a power value (wideband power value) when the ambient noise is extended to a wideband signal.

Figure 3:
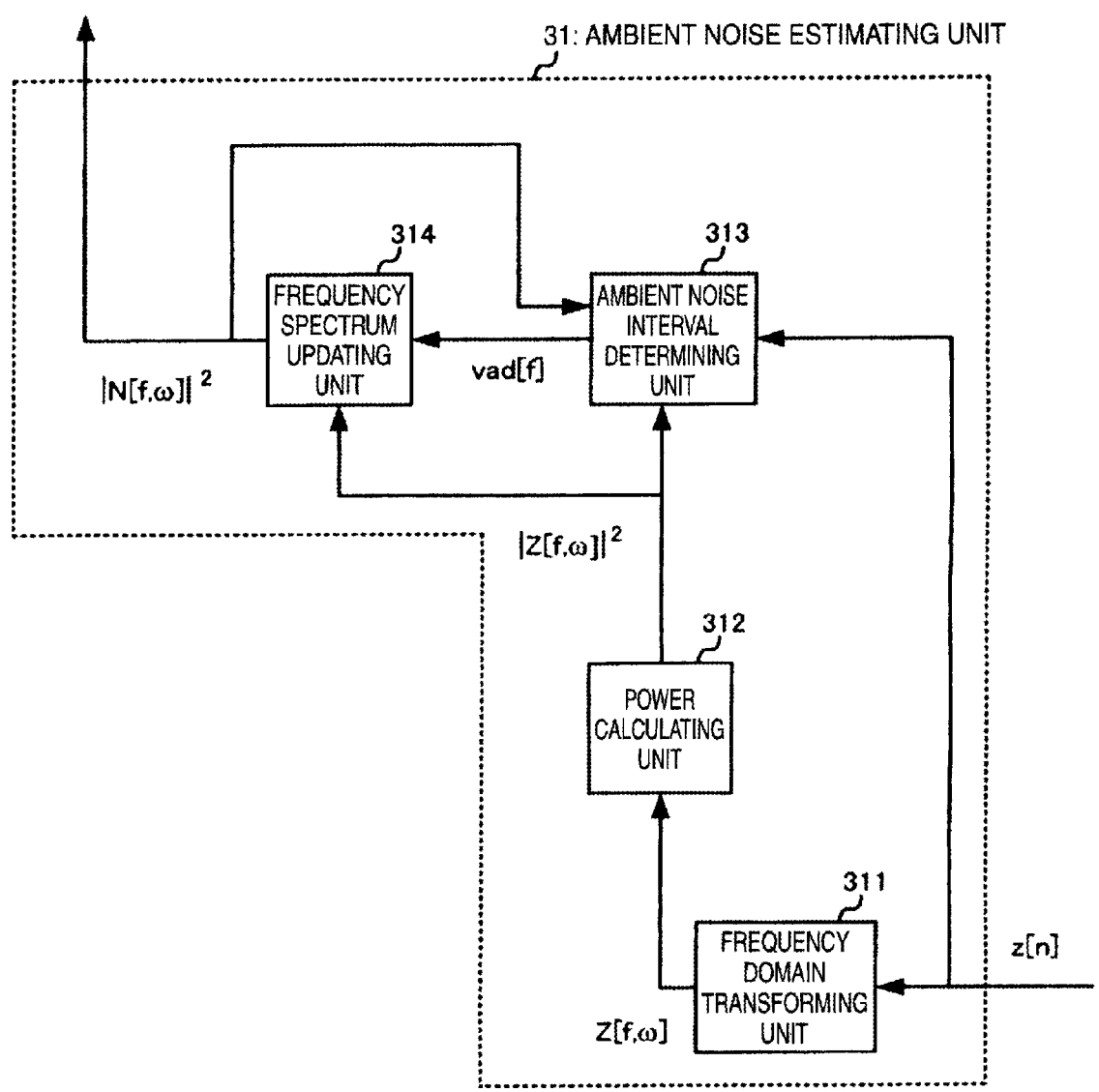
FIG. 3 is a circuit block diagram illustrating an exemplary configuration of an ambient noise estimating unit of the signal processor shown in FIG. 2.

FIG. 3 shows an exemplary configuration of the ambient noise estimating unit 31. The ambient noise estimating unit 31 is provided with a frequency domain transforming unit 311, a power calculating unit 312, an ambient noise interval determining unit 313, and a frequency spectrum updating unit 314.

The ambient noise estimating unit 31 estimates the ambient noise other than the speech signal of the near end speaker from the collection signal z[n] (n=0, 1, ..., N−1) in which the echo components are reduced by the echo suppression processor 8, extracts a power spectrum $|N[f, w]|^2$ of the estimated ambient noise, and outputs the extracted power spectrum to the ambient noise information bandwidth extending unit 32.

The frequency domain transforming unit 311 receives the collection signal z[n] (n=0, 1, ..., N−1) of the current frame f. Then the samples, which correspond to the number of samples which are overlapped by windowing, are extracted from the collection signal in one frame previous to the current frame. The extracted samples are combined with the input signals in the current frame in the time direction. Then, the signals, which correspond to an amount of the samples necessary for the frequency domain transform, are extracted by appropriately performing zero padding or the like. The overlap, which is the ratio of a data length of the collection signal z[n] to a shift width of the collection signal z[n] in the next frame, may be considered to be 50%. In this case, the number of samples, which is overlapped in the previous one frame and the current frame, is set to be L=48 for example, and it is assumed that 2M=256 samples are prepared from the zero padding of the L samples of the collection signal in the previous one frame, the N=160 samples of the collection signal z[n] in the current frame, and the L samples. The 2M samples are subjected to windowing by multiplying a window function of the sine window. Then, the frequency domain transform is performed on the signals of the 2M samples subjected to the windowing. The transform to the frequency domain can be carried out by the FFT of which size is set to 2M, for example. Further, by performing the zero padding on the signals to be subjected to the frequency domain transform, the data length is set to a higher power of 2 (2M), and the size of the frequency domain transform is set to a high power of 2 (2M), but the size of the frequency domain is not limited thereto.

When the collection signal z[n] is a real signal, the redundant M=128 bins are removed from a signal obtained by performing the frequency domain transform, and the obtaining the frequency spectrum Z[f, w] (w=0, 1, ..., M−1) is obtained to be output. In this case, ω represents the frequency bin. Further, when the collection signal is the real signal, the redundant one originally becomes the M−1 (=127) bins, the frequency bin w=M (=128) of the highest frequency band should be considered. However, the signal to be subjected to the frequency domain transform is assumed to be a digital signal including the speech signal with limited bandwidth, and the speech quality is not adversely affected even though the frequency bin w=M of the highest frequency band with limited bandwidth is not taken into consideration. For simple description in the following, the description is made without considering the frequency bin w=M of the highest band. Of course, the frequency bin w=M of the highest frequency band may also be taken into consideration. At this time, the frequency bin w=M of the highest frequency band is equated to w=M−1 or treated independently.

In addition, the window function used in windowing is not limited to the hamming window, but other symmetric windows (hann window, Blackman window, sine window, etc.) or asymmetric windows which are used in a speech encoding process may be appropriately used. The frequency domain transform may by substituted by other orthogonal transforms for transforming to the frequency domain, such as the Discrete Fourier Transform (DFT) or the Discrete Cosine Transform (DCT).

The power calculating unit 312 calculates and outputs the power spectrum $|Z[f, w]|^2$ (w=0, 1, ..., M−1) which is the square sum of a real part and an imaginary part in the frequency spectrum Z[f, w] (w=0, 1, ..., M−1) which is output from the frequency domain transforming unit 311.

The ambient noise interval determining unit 313 uses the collection signal z[n] (n=0, 1, ..., N−1), the power spectrum $|Z[f, w]|^2$ (w=0, 1, ..., M−1) output from the power calculating unit 312, and the power spectrum $|N[f−1, w]|^2$ of the ambient noise in each frequency band from the previous one frame which is output from the frequency spectrum updating unit 314 so as to perform determination on each frame whether the interval is an interval (ambient noise interval) in which the ambient noise is dominantly included in the collection signal z[n] or an interval (speech interval) in which the speech signal of the near end speaker without the ambient noise is mixed with the ambient noise. Then, the power calculating unit 312 outputs frame determination information vad[f] which represents the determination result in each frame. Here, when the interval corresponds to the ambient noise interval, the frame determination information vad[f] is set to 0. When the interval corresponds to the speech interval, the frame determination information vad[f] is set to 1. Hereinafter, the case where only the corresponding component exists or the case where the corresponding component is significantly included more than other components (a case where the corresponding component is included equal to or more than a predetermined threshold value) is expressed as "being dominantly included".

Specifically, the ambient noise interval determining unit 313 calculates plural feature quantities using the collection signal z[n] (n=0, 1, ..., N−1), the power spectrum $|Z[f, w]|^2$, and the power spectrum $|N[f−1, w]|^2$ of the ambient noise in the previous one frame, and outputs the frame determination information vad[f]. Here, as the plural feature quantities, the first autocorrelation coefficient Acorr[f, 1], a maximum autocorrelation coefficient Acorr_max[f], a per-frequency total SNR (signal to noise ratio) snr_sum[f], and a per-frequency SNR variance snr_var[f] will be described as examples.

First, as shown in Expression 1, the ambient noise interval determining unit 313 calculates kth autocorrelation coefficient Acorr[f,k] (k=1, ..., N−1) which is obtained such that the collection signals are normalized by a power in frame units and then the normalized collection signals are taken by the absolute value

[Expression 1]

$$Acorr[f, k] = \left| \frac{\sum_{n=0}^{N-1-k} z[n] \cdot z[n+k]}{\sum_{n=0}^{N-1} z[n] \cdot z[n]} \right| \quad (1)$$

At this time, the ambient noise interval determining unit 313 also calculates the first autocorrelation coefficient Acorr[f, 1] by setting k=1. The value of the first autocorrelation coefficient Acorr[f, 1] is a value from 0 to 1. When the value becomes closer to 0, noise property increases. That is, it is determined that, as the value of the first correlation coefficient Acorr[f, 1] becomes smaller, the ambient noise increases in the collection signal and the speech signal not included in the ambient noise decreases. As shown in Expression 2, the autocorrelation coefficient Acorr[f,k] which is the maximum value among the normalized k-th autocorrelation coefficients Acorr[f,k] is calculated and output as the maximum autocorrelation value Acorr_max[f]. The maximum autocorrelation value Acorr_max[f] is a value from 0 to 1. As the value becomes closer to 0, noise property increases. That is, it is determined that, as the value of the autocorrelation coefficient becomes smaller, the ambient noise increases in the collection signal and the speech signal not included in the ambient noise decreases.

[Expression 2]

$$Acorr\_max[f] = \max_{k=1}^{N-1} \{Acorr[f, k]\} \quad (2)$$

Next, the ambient noise interval determining unit 313 receives the power spectrum $|Z[f, w]|^2$ and the power spectrum $|N[f, w]|^2$ of the ambient noise, and calculates the SN ratio of each frequency band, which is the ratio of two values described above, which is output as snr[f, w] (w=0, 1, ..., M−1) expressed by dB using Expression 3.

[Expression 3]

$$snr[f, \omega] = 10\log_{10}\left(\frac{|Z[f, \omega]|^2}{|N[f, \omega]|^2}\right) \quad (3)$$

The sum of the SN ratios snr[f, w] (w=0, 1, ..., M−1) of the respective frequency bands is calculated using Expression 4, which is output as the per-frequency total SN ratio value snr_sum[f]. The per-frequency total SN ratio value snr_sum[f] takes a value of 0 or greater. As the value becomes smaller, it is determined that the ambient noise such as the noise component is significantly included in the collection signal and the speech signal not included in the ambient noise decreases.

[Expression 4]

$$snr\_sum[f] = \sum_{\omega=0}^{M-1} snr[f, \omega] \quad (4)$$

In addition, the variance of the SN ratio snr[f, w] (w=0, 1, ..., M−1) of each frequency band is calculated by Expression 5, which is output as the per-frequency SN ratio variance value snr_var[f]. The per-frequency SN ratio variation value snr_var[f] is a value of 0 or greater. As the value becomes smaller, it is determined that the ambient noise such as the noise component is significantly included and the speech signal not included in the ambient noise decreases.

[Expression 5]

$$snr\_var[f] = \sum_{\omega=0}^{M-1} \left| snr[f, \omega] - \frac{\sum_{i=0}^{M-1} snr[f, i]}{M} \right| \quad (5)$$

Finally, ambient noise interval determining unit 313 uses the plural feature quantities, such as the first autocorrelation coefficient Acorr[f, 1], the maximum autocorrelation coefficient Acorr_max[f], the per-frequency total SN ratio value snr_sum[f], and the per-frequency SN ratio variation value snr_var[f], to perform the weighting on the respective vales with predetermined weight values, and thus the ambient noise degree type[f] is calculated which is the sum of weight values of the plural feature quantities. Here, as the ambient noise degree type[f] becomes smaller, it is assumed that the ambient noise is dominantly included, and on the other hand, as the ambient noise degree type[f] becomes larger, the speech signal not included in the ambient noise is dominantly included. For example, the weight values $w_1$, $w_2$, $w_3$, and $w_4$ (where, $w_1 \geq 0$, $w_2 \geq 0$, $w_3 \geq 0$, and $w_4 \geq 0$) are set by a learning algorithm which uses the determination of a linear discriminant function, and the target signal degree type[f] is calculated using Expression 6. When the ambient noise degree type[f] is greater than a predetermined threshold value THR, vad[f] is set to 1. When the ambient noise degree type[f] is equal to or less than the predetermined threshold value THR, vad[f] is set to 0.

[Expression 6]

$$type[f] = w_1 \cdot Acorr[f,1] + w_2 \cdot Accor\_max[f] + w_3 \cdot snr\_sum[f] + w_4 \cdot snr\_var[f] \quad (6)$$

As described above, when the plural feature quantities are calculated, the process is performed on each frequency bin. However, the plural feature quantities may be calculated in group units such that groups are created by collecting the plural adjacent frequency bins which are obtained by the frequency domain transform and then the processes are performed in group units. In addition, the process may also be calculated such that the frequency domain transform is implemented by a band division filter such as a filter bank.

All the plural feature quantities may not be used, or other feature quantities may be added to be used. Further, codec information may also be used, which is output from the wireless communication unit 1 or the decoder 2, for example, voice detection information which represents whether the voice is from a silence insertion descriptor (SID) or a voice activity detector (VAD) or not, or information which represents whether a pseudo background noise is generated or not.

The frequency spectrum updating unit 314 uses the frame determination information vad[f] output from the ambient noise interval determining unit 313 and the power spectrum $|Z[f, w]|^2$ (w=0, 1, ..., M−1) output from the power calculating unit 312 so as to estimate and output the power spectrum $|N[f, w]|^2$ (w=0, 1, ..., M−1) of the ambient noise in each frequency band. For example, by setting the frame determination information vad[f] to 0, the power spectrum $|Z[f,$ w]|² of the frame, which is determined that the interval (ambient noise interval) dominantly includes the ambient noise, is attenuated in frame units so as to calculate an average power spectrum which is output as the power spectrum |N[f, w]|² (w=0, 1, . . . , M−1) of the ambient noise in each frequency band. Further, as shown in Expression 8, the calculation of the power spectrum |N[f, w]|² of the ambient noise in each frequency band is recurrently performed using the power spectrum |N[f−1, w]|² of the ambient noise in each frequency band from the previous one frame. In this case, the leakage coefficient $\alpha_N[\omega]$ in Expression 7 is a coefficient of 1 or less, and more preferably, about 0.75 to 0.95.

[Expression 7]

$$|N[f,\omega]|^2 = \alpha N[\omega] \cdot |N[f-1,\omega]|^2 + (1-\alpha_N[\omega]) \cdot |Z[f,\omega]|^2 \quad (7)$$

The ambient noise information bandwidth extending unit 32 generates the power value of the signal, including the frequency band component, which exists in the input signal x[n] but not in the collection signal z[n], using the power spectrum |N[f, w]|² of the ambient noise in each frequency band.

Figure 4:
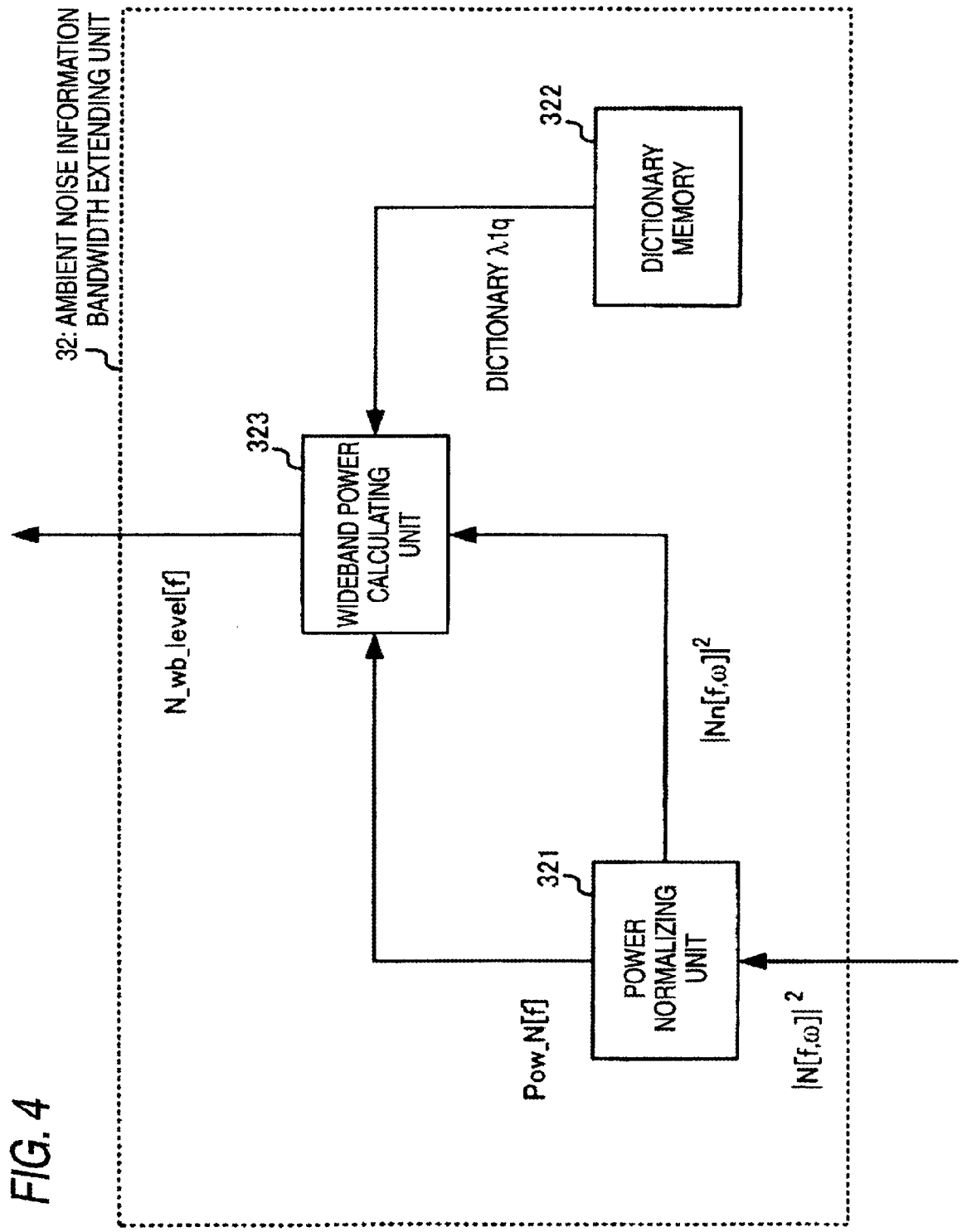
FIG. 4 is a circuit block diagram illustrating an exemplary configuration of an ambient noise information bandwidth extending unit of the signal processor shown in FIG. 2.

FIG. 4 is a view illustrating an exemplary configuration of the ambient noise information bandwidth extending unit 32. The ambient noise information bandwidth extending unit 32 is provided with a power normalizing unit 321, a dictionary memory 322, and a wideband power calculating unit 323.

The ambient noise information bandwidth extending unit 32 calculates narrowband feature quantity data from the narrowband signal information. The ambient noise information bandwidth extending unit 32 prepares in advance the relationship between the narrowband feature quantity data calculated from the narrowband signal information and the wideband feature quantity data through modeling, and calculates the wideband feature quantity data using the relationship with the narrowband feature quantity data and model, and then generates the wide band signal information from the wideband feature quantity data. As described above, here, the narrowband signal information is the power spectrum of the ambient noise. In addition, the wideband feature quantity data is assumed to be equal to the wideband signal information, and the wideband signal information is the volume level which is represented by the wideband power value N_wb_level [f]. As the modeling of the relationship between the narrowband feature quantity data and the wideband feature quantity data, a scheme using the Gaussian MixtureModel (GMM) is employed. Here, the narrowband power value Pow_N[f] is connected to the normalized power spectrum |Nn[f, w]|² (w=0, 1, . . . , M−1) of the ambient noise in the dimension direction to be used as the Dnb-th narrowband feature quantity data, and the wideband power value N_wb_level [f] is used as the Dwb-th wideband feature quantity data (Dnb=M+1, Dwb=1).

First, in order to calculate the narrowband feature quantity data from the narrowband signal information, the power normalizing unit 321 receives the power spectrum |N[f, w]|² (w=0, 1, . . . , M−1) of the ambient noise which is output from the ambient noise estimating unit 31, and calculates the narrowband feature quantity data using the power spectrum of the ambient noise. One of the narrowband feature quantity data is the narrowband power value Pow_N[f] which is calculated based on Expression 8 and is the total sum of the respective frequency bins of the power spectrum.

[Expression 8]

$$\text{Pow\_N}[f] = \sum_{\omega=0}^{M-1} |N[f, \omega]|^2 \quad (8)$$

In addition, as another narrowband feature quantity data, the power spectrum |Nn[f, w]|² is calculated by normalizing the power spectrum |N[f, w]|² of each frequency bin by Expression 9 using the narrowband power value Pow_N[f].

[Expression 9]

$$|N_n[f, \omega]|^2 = \frac{|N[f, \omega]|^2}{\text{Pow\_N}[f]} \quad (9)$$

The dictionary memory 322 stores the dictionary $\lambda 1_q = \{w_q, \mu_q, \Sigma_q\}$ (q=1, . . . , Q) of the GMM with the number of mixture Q (here, Q=64) which is learned through modeling of the relationship between the Dnb-th narrowband feature quantity data and the Dwb-th wideband feature quantity data based on the previously collected ambient noise. Further, $w_q$ represents the mixed weight of the q-th normal distribution, $\mu_q$ represents an average vector of the q-th normal distribution, and $\Sigma_q$ represents a covariance matrix (a diagonal covariance matrix or a total covariance matrix) of the q-th normal distribution. Further, the dimension which is the number of lines or rows of the average vector $\mu_q$ and the covariance matrix $\Sigma_q$ is Dnb+Dwb.

Figure 5:
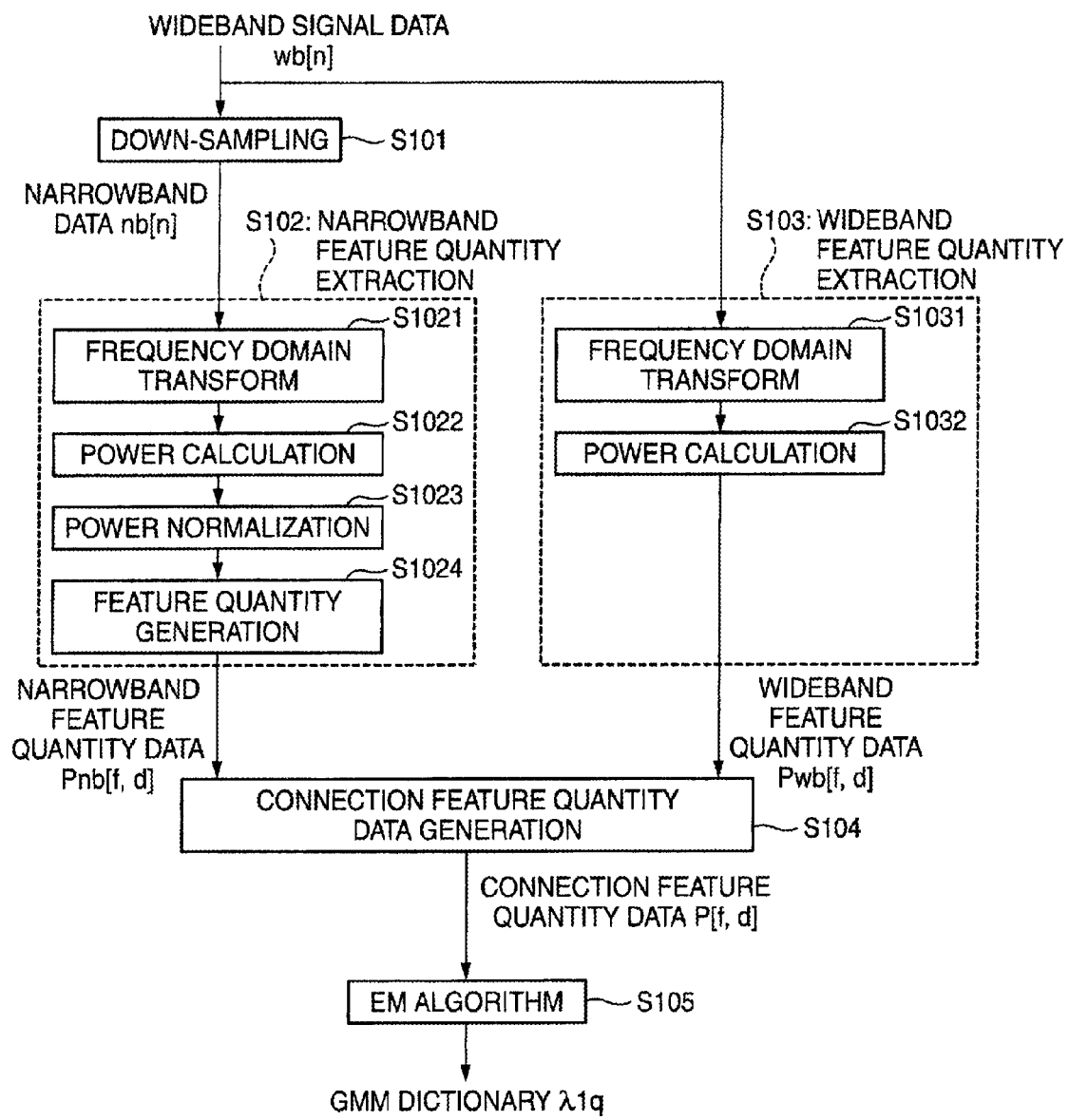
FIG. 5 is an exemplary flowchart illustrating a method of generating a dictionary in a dictionary memory of the ambient noise information bandwidth extending unit shown in FIG. 4.

The method of previously learning and generating the dictionary $\lambda 1_q$ in the dictionary memory 322 will be described with reference to FIG. 5 showing a flowchart.

The signal to be used in generation of the GMM is a signal group which has the same sampling frequency fs' [Hz] as that of the input signal x[n] and is obtained by separately collecting the wideband signals with limited bandwidth ranging from fs_wb_low [Hz] to fs_wb_high [Hz]. It is preferable for the signal group to be gathered in various environments and to have various volume levels. In the following, the signal group of the wideband signals used in the generation of the GMM is collectively denoted by the wideband signal data wb[n]. Here, n represents time (sample).

First, the wideband signal data wb[n] is input, and is downsampled at the sampling frequency fs [Hz] by the downsampling filter, so that the narrowband signal data nb[n] is obtained which is limited in the narrowband ranging from fs_nb_low [Hz] to fs_nb_high [Hz] (step S101). As a result, the signal group is generated which is limited in bandwidth so as to be equal to the collection signal z[n]. Further, when an algorithm delay (not shown) occurs in the down-sampling filter or the bandwidth limitation process, a process is performed in which the narrowband signal data nb[n] is synchronized with the wideband signal data wb[n].

Next, the narrowband feature quantity data Pnb[f, d] (d=1, . . . , Dnb) is extracted from the narrowband signal data nb[n] in frame units (step S102). The narrowband feature quantity data Pnb[f, d] is a feature quantity data which represents the narrowband signal information of a predetermined order. In step S102, first, similar to the process performed by the frequency domain transforming unit 311, the frequency domain transforming process is performed on the narrowband signal data nb[n] in each frame, so that the power spectrum of the narrowband signal data nb[n] of order M is obtained (step S1021). Next, by a process similar to the process performed by the power normalizing unit 321, the power calculation is performed on the narrowband signal data nb[n] in each frame, so that the first power value is obtained (step S1022). Then, the normalized power spectrum of the narrowband signal data nb[n] of order M is obtained from these power spectrum and the power value (step S1023). The normalized power spectrum of order M is connected to the first power value in the order direction (dimensional direction) in frame units, so that the narrowband feature quantity data Pnb[f, d] (d=1, . . . , Dnb) of the Dnb (=M+1) order is generated (step S1024).

On the other hand, at the same time with the process described above, the wideband feature quantity data Pwb[f, d] (d=1, . . . , Dwb) is extracted from the wideband signal data wb[n] in the frame unit f (step S103). The wideband feature quantity data Pwb[f, d] is feature quantity data which represents the wideband signal information of a predetermined order. In step S103, first, similar to the process performed by the frequency domain transforming unit 311 by increasing the size of the FFT process by twice (4M), the frequency domain transforming process is performed on the wideband signal data wb[n] in each frame, so that the power spectrum of the 2M-th wideband signal data wb[n] is obtained (step S1031). Next, by a process similar to the process performed by the power normalizing unit 321, the power calculating is performed on the wideband signal data wb[n] in each frame, so that the first power value is obtained. The power value is output as the wideband feature quantity data Pwb[f, d] of the Dwb (=1) order (step S1032).

Next, two feature quantity data, which are the narrowband feature quantity data Pnb[f, d] (d=1, . . . , Dnb) and the wideband feature quantity data Pwb[f, d] (d=1, . . . , Dwb) in temporal synchronization with each other, are connected in the order direction (dimensional direction) in frame units, so that the connection feature quantity data P[f, d] (d=1, . . . , Dnb+Dwb) of the Dnb+Dwb order is generated (step 104).

Then, there is a process in which the initial GMM of the number of mixture Q=1 is generated from the connection feature quantity data P[f, d], another mixed variance is generated by slightly shifting the average vector of each GMM and thus the number of mixture Q is increased by two times. This process and a process, in which a maximum likelihood estimation of the GMM is performed until the connection feature quantity data P[f, d] converges by the EM algorithm, are repeatedly performed in turns. Therefore, the GMM $\lambda 1_q = \{w_q, \mu_q, \Sigma_q\}$ (q=1, . . . , Q) with the number of mixture Q (here, Q=64) is generated (step S105). The EM algorithm is specifically described in documents such as "Robust text-independent speaker identification using Gaussian mixture models", D. A. Reynols and R. C. Rose, IEEE Trans. Speech and Audio Processing, Vol. 3, no. 1, pp. 72-83, January 1995.

Returning to the description of FIG. 4, in the wideband power calculating unit 323, the narrowband power value Pow_N[f] and the normalized Dnb-th power spectrum |Nn[f, w]|² (w=0, 1, . . . , M−1) of the ambient noise, which are output from the power normalizing unit 321, are connected and input as the narrowband feature quantity data Pn_nb[f] (d=1, . . . , Dnb). In addition, the wideband power calculating unit 323 reads the dictionary $\lambda 1_q = \{w_q, \mu_q, \Sigma_q\}$ (q=1, . . . , Q) of the GMM from the dictionary memory 322. According to the Minimum Mean Square Error (MMSE) estimation, as shown in Expression 10, the wideband power calculating unit 323 performs the conversion to the feature quantity data, which corresponds to the wideband to which the frequency band is extended, by the soft clustering with the plural normal distribution models and the continuous linear regression. The wideband power value N_wb_lever[f] which is the wideband feature quantity data is calculated from the narrowband feature quantity data Pn_nb[f] to be output. Expression 10 is described as the vector in the dimensional direction (d= 1, . . . , Dnb+Dwb). In addition, the average vector $\mu_q$ (d= 1, . . . , Dnb+Dwb) is divided into $\mu_q^N$ (d=1, . . . , Dnb) and $\mu_q^W$ (d=Dnb, . . . , Dnb+Dwb) in the dimensional direction. As described below, also the covariance matrix $\Sigma_q$, which is a (Dn+Dw)×(Dn+Dw) matrix, is divided into $\Sigma_q^{NN}$ which is a Dn×Dn matrix, $\Sigma_q^{NW}$ which is a Dn×Dw matrix, $\Sigma_q^{WN}$ which is a Dw×Dn matrix, and $\Sigma_q^{WW}$ which is a Dw×Dw matrix.

[Expression 10]

$$N\_wb\_level[f] = \sum_{q=1}^{Q} h_q(\text{Pn\_nb}[f]) \cdot \{\mu_q^W + \Sigma_q^{WN}(\Sigma_q^{NN})^{-1}(\text{P\_nb}[f] - \mu_q^N)\} \quad (10)$$

wherein $$h_q(x) = \frac{\frac{W_q}{(2\pi)^{\frac{D_{nb}+D_{wb}}{2}} \cdot |\Sigma_q^{NN}|^{\frac{1}{2}}} \exp\left\{-\frac{1}{2}(x-\mu_q^N)^T(\Sigma_q^{NN})^{-1}(x-\mu_q^N)\right\}}{\sum_{j=1}^{Q} \frac{W_j}{(2\pi)^{\frac{D_{nb}+D_{wb}}{2}} \cdot |\Sigma_j^{NN}|^{\frac{1}{2}}} \exp\left\{-\frac{1}{2}(x-\mu_j^N)^T(\Sigma_j^{NN})^{-1}(x-\mu_j^N)\right\}}$$

$$\Sigma_q = \begin{bmatrix} \Sigma_q^{NN} & \Sigma_q^{NW} \\ \Sigma_q^{WN} & \Sigma_q^{WW} \end{bmatrix}$$

$$\mu_q = \begin{bmatrix} \mu_q^N \\ \mu_q^W \end{bmatrix}$$

In the ambient noise information bandwidth extending unit 32, the wideband feature quantity data is equal to the wideband signal information, so that the wideband power value N_wb_level [f], which is the wideband signal information, is obtained from the power spectrum |N[f, w]|² of the ambient noise which is the narrowband signal information.

Figure 6:
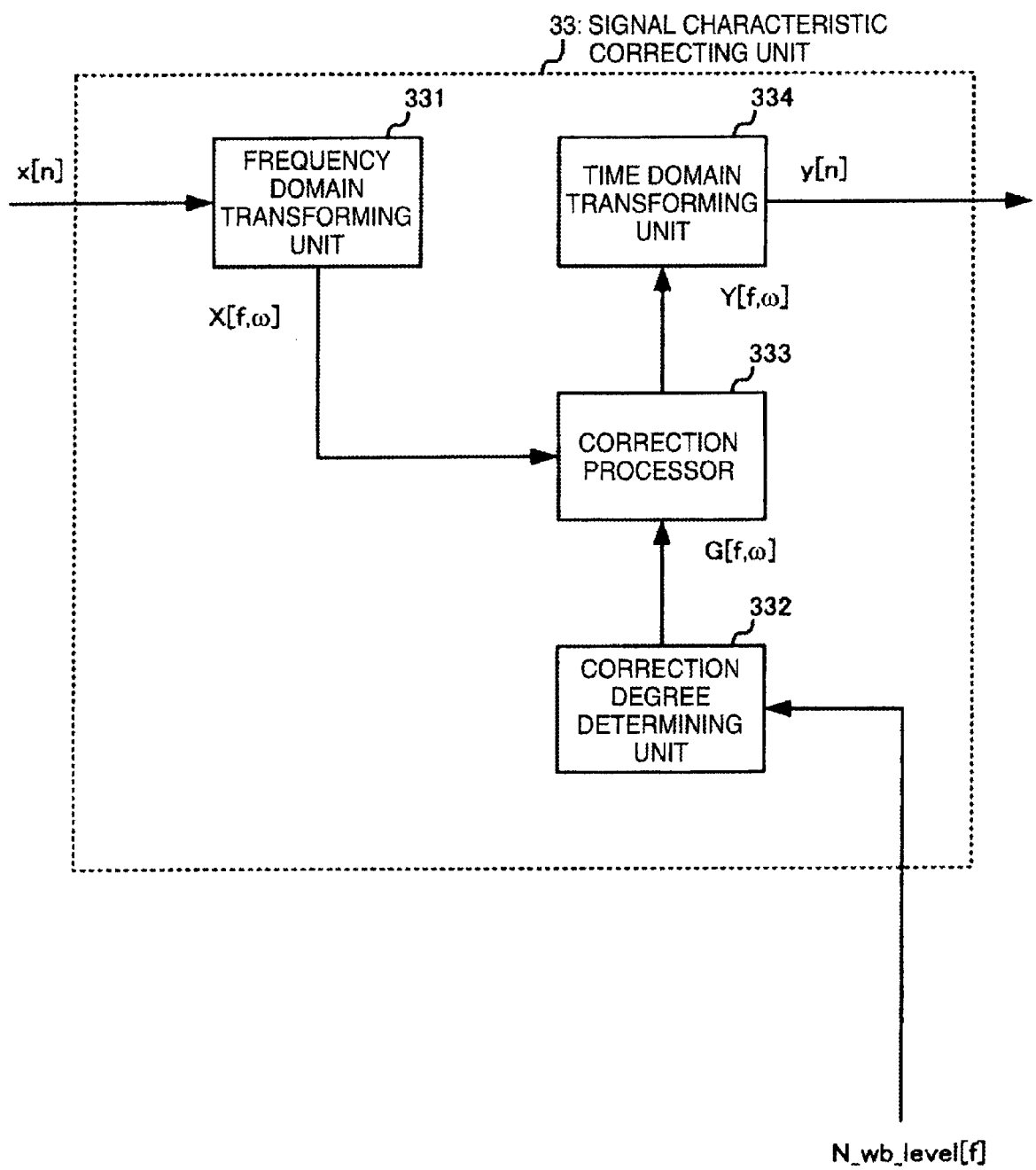
FIG. 6 is a circuit block diagram illustrating an exemplary configuration of a signal characteristics correcting unit of the signal processor shown in FIG. 2.

FIG. 6 shows an exemplary configuration of the signal characteristic correcting unit 33. The signal characteristic correcting unit 33 is provided with a frequency domain transforming unit 331, a correction degree determining unit 332, a correction processor 333, and a time domain transforming unit 334. The signal characteristic correcting unit 33 receives the input signal x[n] (n=0, 1, . . . , 2N−1) and the wideband power value N_wb_level[f], performs a signal correcting process for articulating the input signal such that the input signal x[n] is not mixed with the ambient noise which is included in the collection signal, and outputs the corrected output signal y[n] (n=0, 1, . . . , 2N−1).

The frequency domain transforming unit 331 receives the input signal x[n] (n=0, 1, . . . , 2N−1) instead of the collection signal z[n] (n=0, 1, . . . , N−1) in the frequency domain transforming unit 311. The frequency domain transforming unit 331 outputs the frequency spectrum X[f, w] of the input signal x[n] by the same process as that of the frequency domain transforming unit 331. For example, in the frequency domain transforming unit 331, the number of samples, which overlaps in the previous one frame and the current frame, is set to be L=96, and 4M=512 samples are prepared from the zero padding of the L samples of the input signal in the previous one frame, the 2N=320 samples of the input signal x[n] in the corresponding frame, and the L samples. The 4M samples are subjected to windowing by multiplying the window function of the sine window. Then, by the FFT of which size is set to 4M, the frequency domain transform is performed on the signals of the 4M samples subjected to the windowing.

The correction degree determining unit 332 receives the wideband power value N_wb_level [f] which is output from the ambient noise information bandwidth extending unit 32. Then, the correction gain G[f, w] (w=0, 1, . . . , 2M−1) is calculated by Expression 11 and output.

[Expression 11]

$$G[f, \omega] = \frac{\text{N\_wb\_level}[f]}{N_0} \tag{11}$$

In Expression 11, $N_0$ is a reference power value of the ambient noise, which is obtained by measuring in advance the power of the ambient noise in a normal usage environment at the same sampling frequency and the same band limitation as the input signal x[n]. In this way, even though the power value of the ambient noise in the environment (that is, the environment in which the ambient noise is significantly included) is larger than that in the normal usage environment, the correction gain G[f, w] is set by that much, so that the input signal x[n] can be clarified.

The correction processor 333 receives the frequency spectrum X[f, w] (w=0, 1, . . . , 2M−1) of the input signal x[n] and the correction gain G[f, w] (w=0, 1, . . . , 2M−1) which is output from the correction degree determining unit 332. Then, the frequency spectrum X[f, w] of the input signal x[n] is corrected by Expression 12, and the frequency spectrum Y[f, w] (w=0, 1, . . . , 2M−1) of the output signal y[n] which is the correction result is output.

[Expression 12]

$$Y[f,\omega]=G[f,\omega] \cdot X[f,\omega] \tag{12}$$

The time domain transforming unit 334 performs the time domain transform (frequency inverse transform) on the frequency spectrum Y[f, w] (w=0, 1, . . . , 2M−1) which is output from the correction processor 333 appropriately performs a process of returning the amount of the overlapped portion taking into consideration of the windowing in the frequency domain transforming unit 331 so as to calculate the output signal y[n] which is a corrected signal. For example, taking into consideration that the input signal x[n] is the real signal, the frequency spectrum Y[f, w] (w=0, 1, . . . , 2M−1) is restored in a range of w=0, 1, . . . , 4M−1, and the inverse Fast Fourier Transform (IFFT) in which the size is 4M is performed on the restored signal. Then, taking into consideration the windowing, the amount of the overlapped portion is returned using the output signal y[n] which is the corrected signal in the previous one frame, and the output signal y[n] is calculated.

As described above, in the input signal to be reproduced and the collection signal, even when the frequency bands in which the signal components exist are different from each other or when the sampling frequencies are different from each other, the input signal is extended and estimated taking into consideration the frequency band of the input signal in accordance with the volume level of the collection signal. Therefore, the volume level of the collection signal is calculated with high accuracy, and the intelligibility of the input signal can be improved.

Figure 7A:
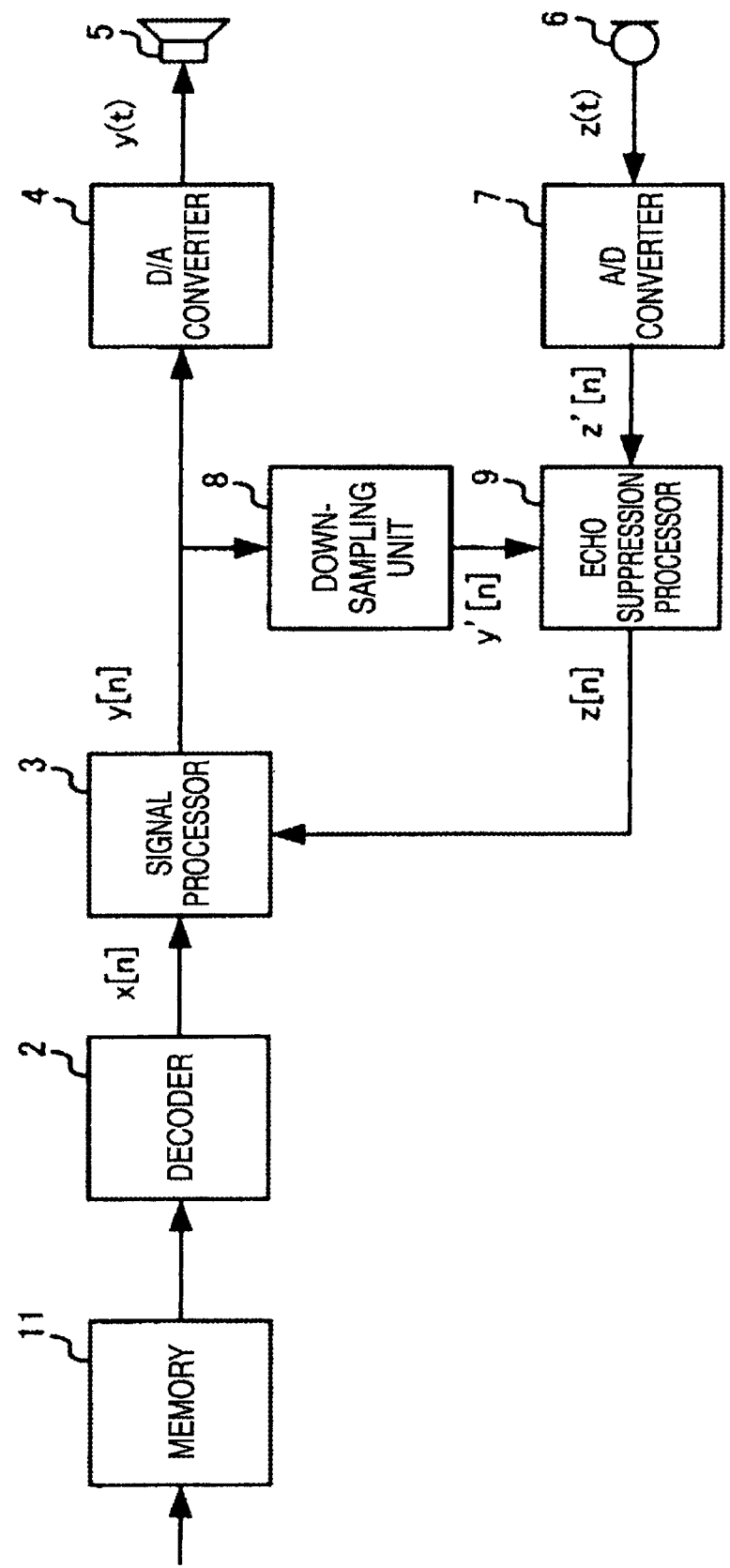
FIGS. 7A and 7B are exemplary circuit block diagrams illustrating a configuration of a communication apparatus and a digital audio player to which the signal processing apparatus according to the first embodiment of the invention is applied.

In the above description, the case where the invention is applied to the communication apparatus has been described, but as shown in FIG. 7A, the invention can also be applied to a digital audio player. The digital audio player is provided with a memory 11 which uses a flash memory or a Hard Disk Drive (HDD), and the decoder 2 which decodes the music and audio data which are read from the memory 11. At this time, the music and audio signals are the target signal which is the signal to be decoded and reproduced. The collection signal z(t) which is collected by the microphone 6 of the digital audio player includes noise components, which are caused by the speech of the near end speaker or the ambient environment, and echo components which are caused by the output signal y(t) and the acoustic space, but the music and audio signals are not included. In this case, since, unlike with the communication apparatus, the speech of the near end speaker is not needed, all the components including the speech sound of the near end speaker are treated as the ambient noise.

Figure 7B:
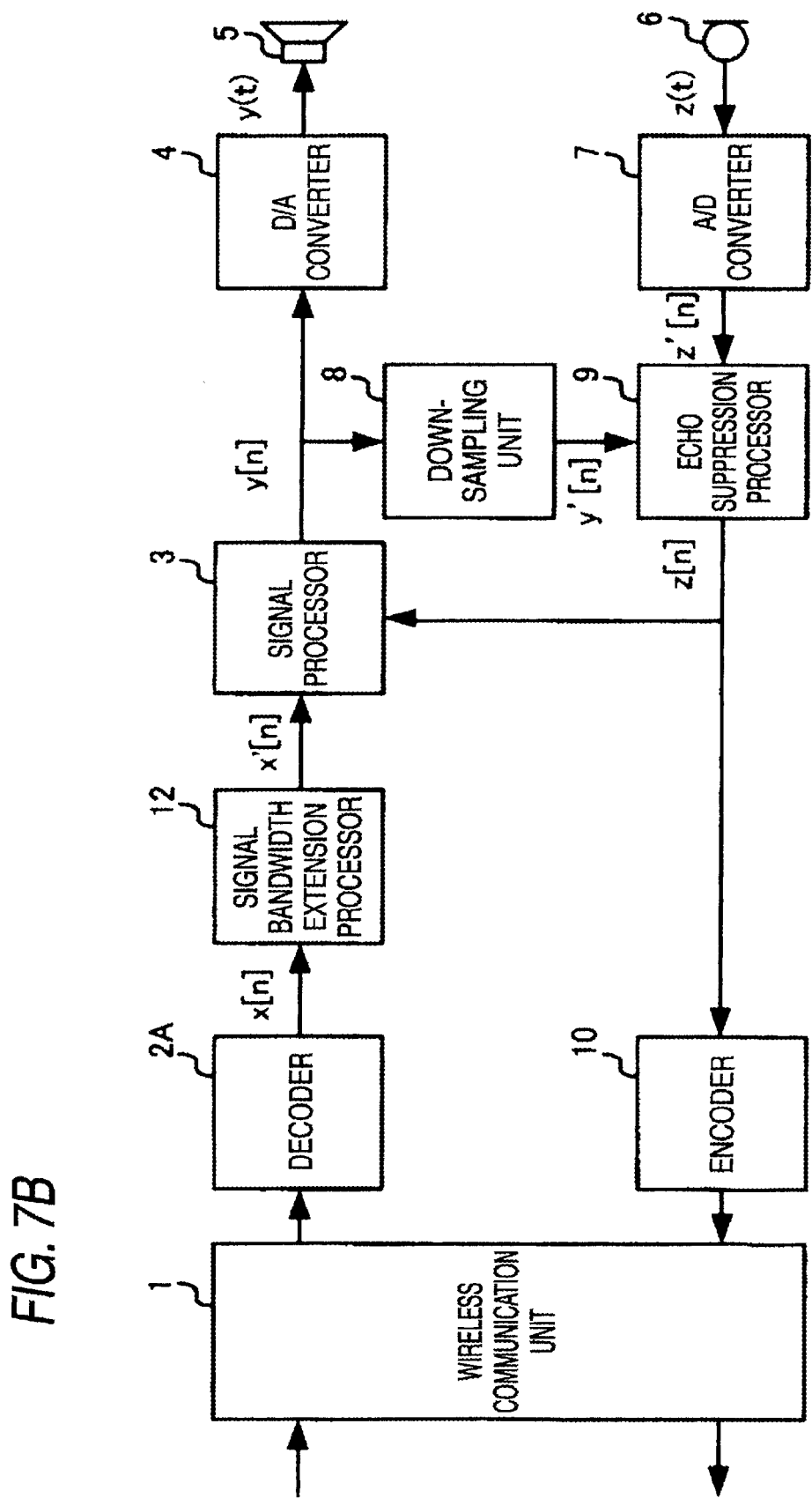

In addition, as shown in FIG. 7B, the invention is applied to the communication apparatus, and can also be applied to a speech bandwidth extending communication apparatus. The speech bandwidth extending communication apparatus is provided with a decoder 2A and a signal bandwidth extension processor 12 between the decoder 2A and the signal processor 3. In this case, the signal processor 3 performs the above-mentioned process on the input signal x′ [n] which is extended in the bandwidth.

Further, the process performed by the signal bandwidth extension processor 12 is a process of extending the input signal in the narrowband with limited bandwidth ranging from fs_nb_low [Hz] to fs_nb_high [Hz] to the wideband signal ranging from fs_wb_low [Hz] to fs_wb_high [Hz]. For example, the existing techniques described in Japanese Patent No. 3189614, Japanese Patent No. 3243174, or JP-A-9-55778 may be performed.

(First Modified Example of Signal Processor)

Next, in the following descriptions, the narrowband signal information used in the signal processor is assumed to be the power spectrum of the ambient noise, and the wideband signal information is assumed to be the masking threshold value (wideband masking threshold value) when the ambient noise is extended to a wideband signal.

Figure 8:
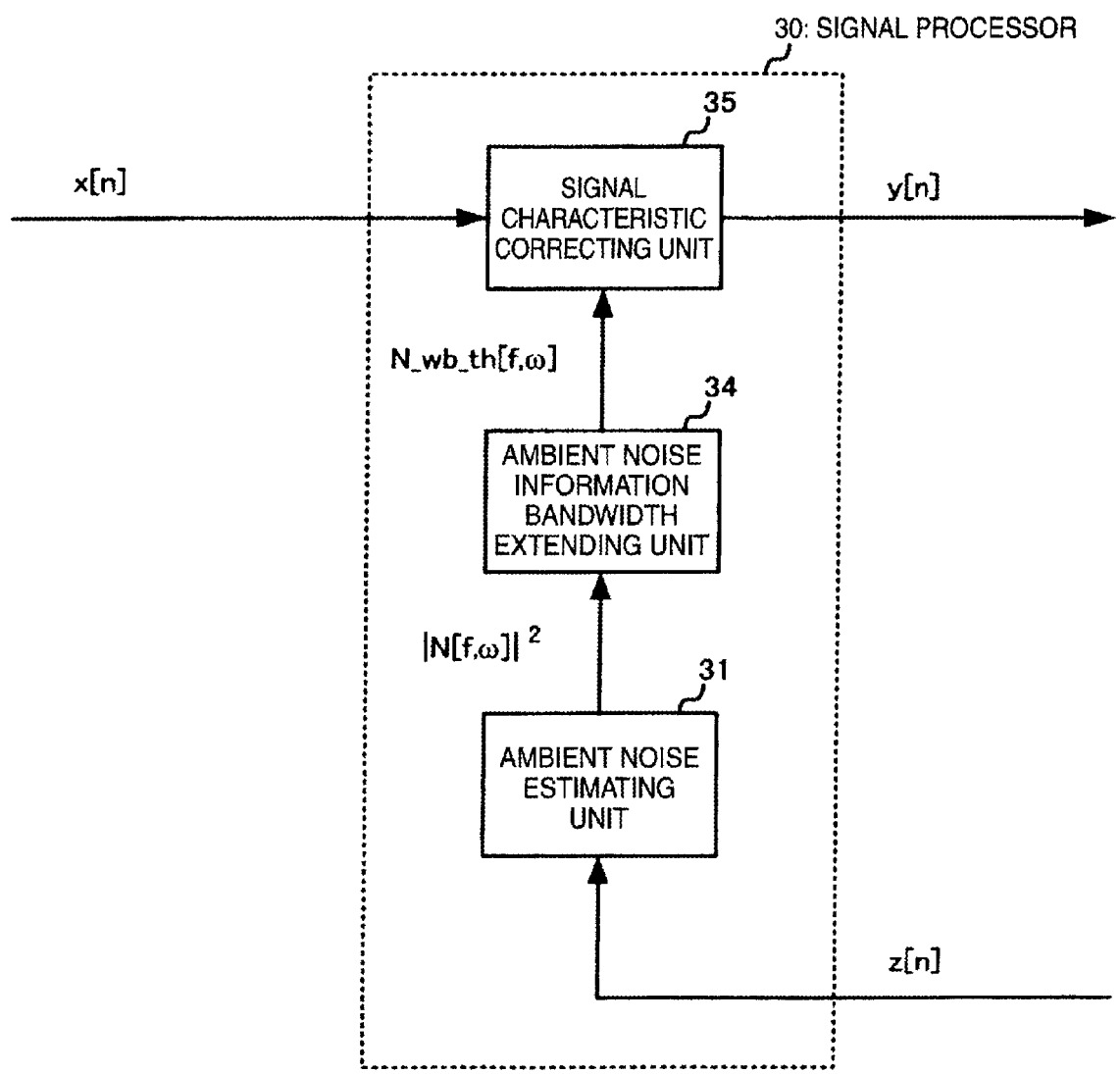
FIG. 8 is an exemplary circuit block diagram illustrating a configuration of a signal processor according to a first modified example of the invention.

FIG. 8 shows a configuration of the signal processor. The signal processor 30 is configured to include an ambient noise information bandwidth extending unit 34 and a signal characteristic correcting unit 35 instead of the ambient noise information bandwidth extending unit 32 and the signal characteristic correcting unit 33 which are used by the signal processor 3.

Figure 9:
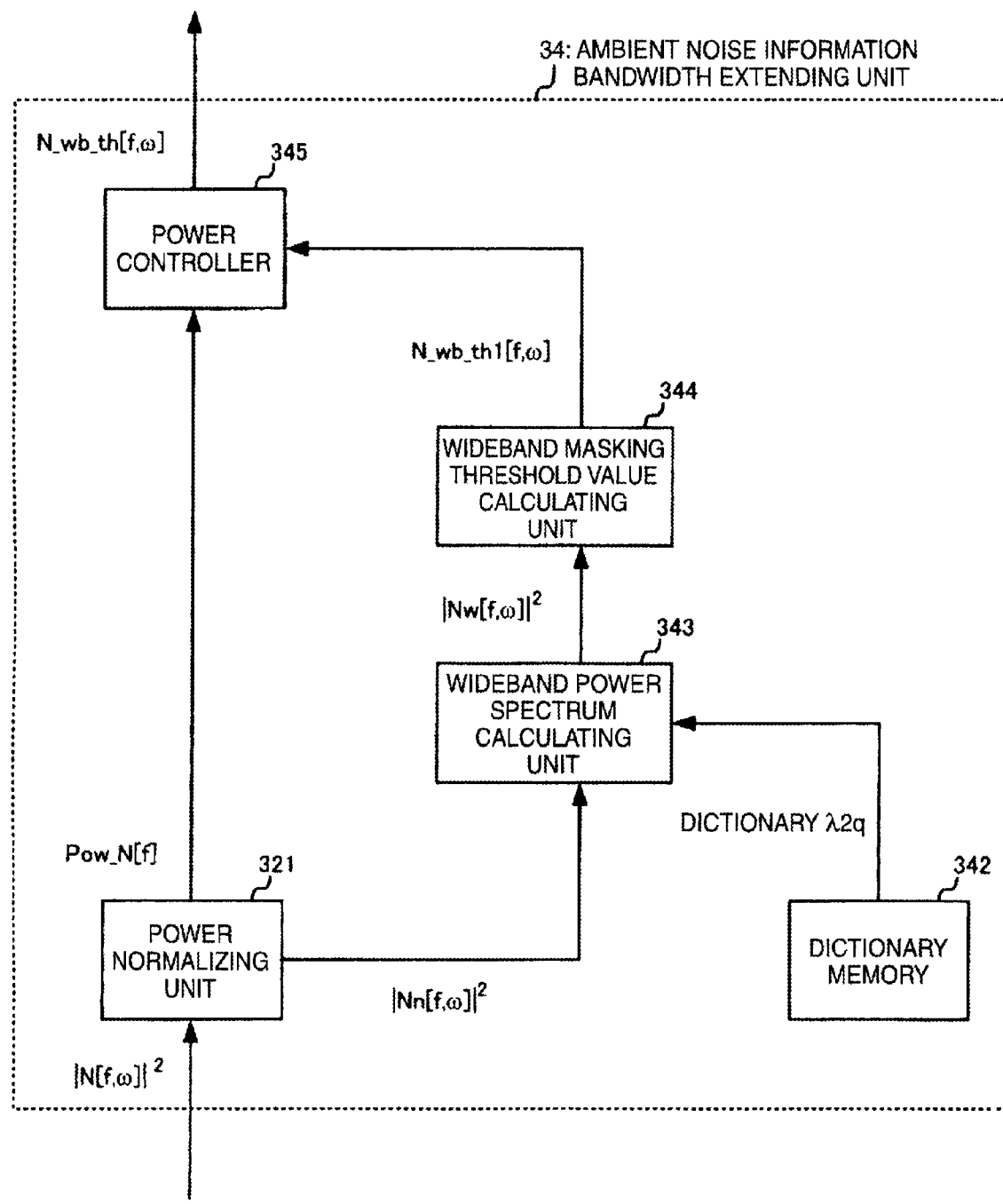
FIG. 9 is a circuit block diagram illustrating an exemplary configuration of an ambient noise information bandwidth extending unit of the signal processor shown in FIG. 8.

FIG. 9 shows an exemplary configuration of the ambient noise information bandwidth extending unit 34. The ambient noise information bandwidth extending unit 34 is provided with a power normalizing unit 321, a dictionary memory 342, and a wideband power spectrum calculating unit 343, a wideband masking threshold value calculating unit 344, and a power controller 345.

Similar to the ambient noise information bandwidth extending unit 32, the ambient noise information bandwidth extending unit 34 receives the power spectrum of the ambient noise, and generates the information (wideband signal information) including the frequency band component which exists in the input signal x[n] but not in the collection signal z[n]. That is, the ambient noise information bandwidth extending unit 34 calculates the narrowband feature quantity data from the narrowband signal information. The ambient noise information bandwidth extending unit 34 prepares in advance the relationship between the narrowband feature quantity data calculated from the narrowband signal information and the wideband feature quantity data through modeling, and calculates the wideband feature quantity data using the relationship with the narrowband feature quantity data which is obtained through modeling, and then generates the wideband signal information from the wideband feature quantity data. In this case, the ambient noise information bandwidth extending unit 34 employs a scheme using a codebook with vector quantization to perform modeling of the relationship between the narrowband feature quantity data and the wideband feature quantity data. Here, the normalized power spectrum $|Nn[f, w]|^2$ (w=0, 1, . . . , M−1) of the ambient noise is used as the Dnb-th narrowband feature quantity data, and the normalized wideband power spectrum $|Nw[f, w]|^2$ (w=0, 1, . . . , 2M−1) of the ambient noise is used as the Dwb-th wideband feature quantity data (Dnb=M, Dwb=2M). Specifically, the ambient noise information bandwidth extending unit 34 receives the power spectrum $|N[f, w]|^2$ (w=0, 1, . . . , M−1) of the ambient noise, generates the power spectrum of the frequency band component which exists in the input signal x[n] but not in the collection signal z[n] by the frequency band extension on the power spectrum $|N[f, w]|^2$ of the ambient noise, calculates the masking threshold value of the power spectrum which is extended in the bandwidth, and outputs the wideband masking threshold value N_wb_th[f, w] (w=0, 1, . . . , 2M−1) obtained from the result.

The dictionary memory 342 stores the dictionary $\lambda 2_q = \{\mu x_q, \mu y_q\}$ (q=1, . . . , Q) of the codebook with a size Q (here, Q=64) which is previously learned through modeling of the relationship between the Dnb-th narrowband feature quantity data and the Dwb-th wideband feature quantity data. Further, $\mu x_q$ represents a centroid vector of the narrowband feature quantity data in the q-th codebook, and $\mu y_q$ represents a centroid vector of the wideband feature quantity data of the q-th codebook. Further, the dimension of the code vector of the codebook is the sum (Dnb+Dwb) of the components of the centroid vector $\mu x_q$ of the narrowband feature quantity data and the centroid vector $\mu y_q$ of the wideband feature quantity data.

Figure 10:
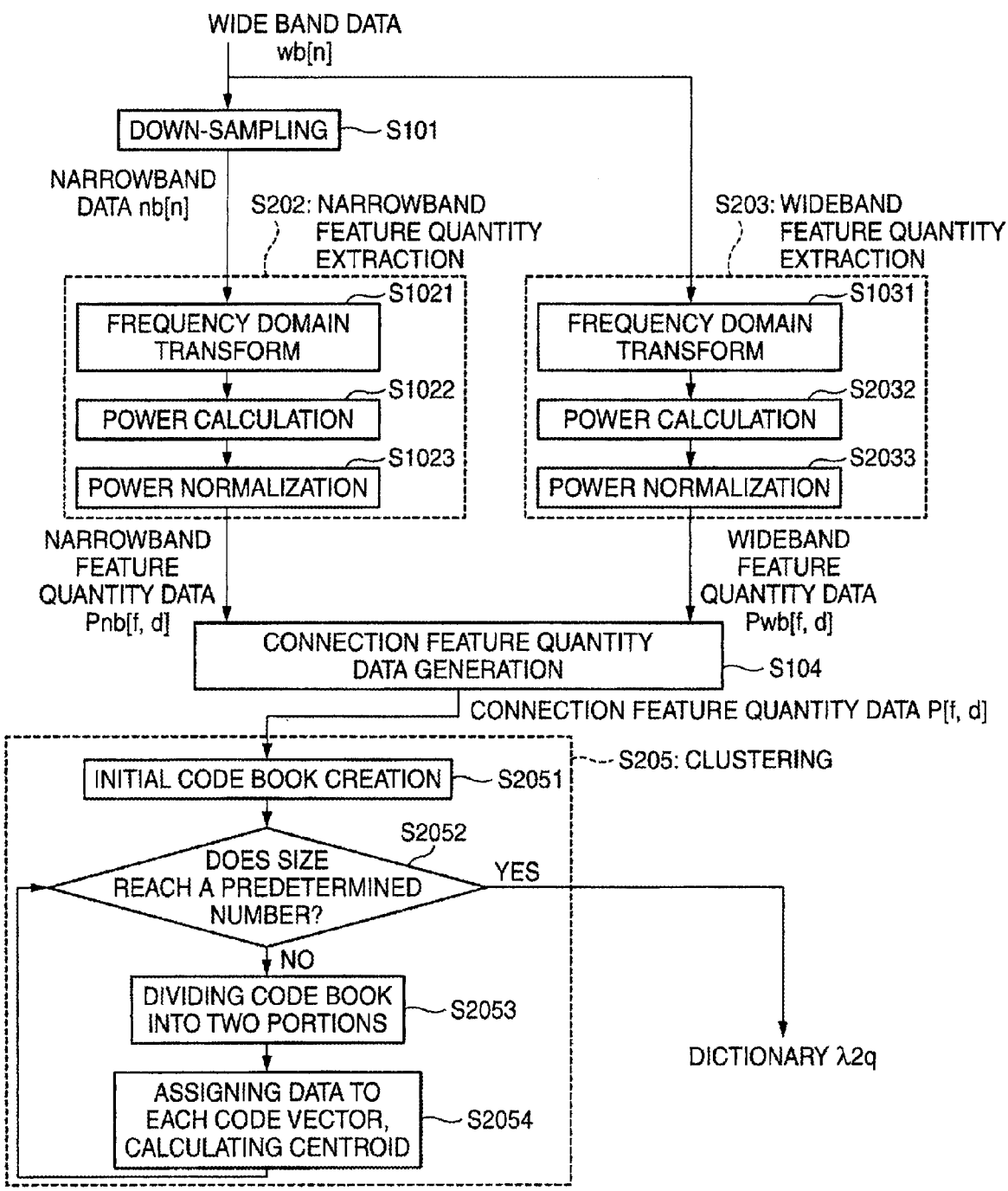
FIG. 10 is an exemplary flowchart illustrating a method of generating a dictionary in a dictionary memory of the ambient noise information bandwidth extending unit shown in FIG. 9.

The method of previously learning and generating the dictionary $\lambda 2_q$ in the dictionary memory 342 will be described with reference to FIG. 10 showing a flowchart. In the following descriptions, the same processes as those of the method of learning and generating the dictionary $\lambda 1_q$ described above are designated by the same reference numerals, and for simple and clear description, the description already given will be omitted as needed.

The signal used in generation of the dictionary of the codebook is a signal group which has the same sampling frequency fs′ [Hz] as that of the input signal x[n] and is obtained by separately collecting the wideband signals with limited bandwidth ranging from fs_wb_low [Hz] to fs_wb_high [Hz]. It is preferable for the signal group to be gathered in various environments and to have various volume levels. In the following, the signal group of the wideband signals used in the generation of the dictionary of the codebook is collectively denoted by the wideband signal data wb[n]. In addition, n represents time (sample).

First, the wideband signal data wb[n] is input, and is downsampled at the sampling frequency fs [Hz], so that the narrowband signal data nb[n] is obtained (step S101). Then, the narrowband feature quantity data Pnb[f, d] (d=1, . . . , Dnb), which is the feature quantity data representing the narrowband signal information, is extracted from the narrowband signal data nb[n] (step S202). In step S202, the power spectrum (M-th) of the narrowband signal data nb[n] is obtained (step S1021), the power value of the narrowband signal data nb[n] is obtained (step S1022), the normalized power spectrum of the narrowband signal data nb[n] is obtained from the power spectrum and the power value (step S1023), and the narrowband feature quantity data is extracted by outputting the normalized power spectrum as the narrowband feature quantity data Pnb[f, d] (d=1, . . . , Dnb) of the Dnb-th (=M) order.

On the other hand, the wideband feature quantity data Pwb[f, d] (d=1, . . . , Dwb), which is the feature quantity data representing the wideband signal information, is extracted from the wideband signal data wb[n] (step S203). In step S203, the power spectrum of the wideband signal data wb[n] is obtained (step S1031), the power value of the wideband signal data wb[n] is obtained from the wideband signal data wb[n] in frame units (step S2032), the normalized power spectrum of the wideband signal data wb[n] is obtained from the power spectrum and the power value in frame units (step S2033), and the extraction of the wideband feature quantity data is performed by outputting the normalized power spectrum as the wideband feature quantity data Pwb[f, d] (d=1, . . . , Dwb) of the Dwb (=2M) order.

Next, the narrowband feature quantity data Pnb[f, d] (d=1, . . . , Dnb) and the wideband feature quantity data Pwb[f, d] (d=1, . . . , Dwb) are connected, so that the connection feature quantity data P[f, d] (d=1, . . . , Dnb+Dwb) of the Dnb+Dwb order is generated (step S104).

The dictionary $\lambda 2_q = \{x_q, \mu y_q\}$ (q=1, . . . , Q) of the codebook with a size Q (here, Q=64) is generated from the connection feature amount P[f, d] using a scheme of the clustering performed by the k-means algorithm or the LBG algorithm (step S205). In step S205, first, the narrowband centroid vector $\mu x_1$, is set to the average of all the narrowband feature quantity data, and the wideband centroid vector $\mu y_1$ is set to the average of all the wideband feature quantity data, and then the initial codebook with a size Q=1 is generated (step S2051). It is determined whether or not the size Q of the codebook reaches a predetermined number (which corresponds to 64 in this case) (step S2052). When the size Q of the codebook does not reach the predetermined number, a process is performed in which another code vector is generated by slightly shifting the narrowband centroid vector $\mu x_q$ and the wideband centroid vector $\mu y_q$ in each code vector of the codebook $\lambda 2_q$, and thus the size Q of the codebook is increased by two times (step S2053). Then, in regard to the connection feature quantity data P [f, d] of the Dnb+Dwb order, the code vector is calculated where the narrowband centroid vector $\mu x_q$ in terms of each code vector of the codebook $\lambda 2_q$ is minimized in a predetermined distance scale (for example, Euclidian distance or Mahalanobis distance) and the connection feature quantity data P[f, d] is assigned to the corresponding code vector thereof. Thereafter, the narrowband centroid vector $\mu x_q$ and the wideband centroid vector $\mu x_q$ are newly calculated for each code vector, and the codebook $\lambda 2_q = \{\mu x_q, \mu y_q\}$ (q=1, . . . , Q) is updated (step S2054). When the size Q of the codebook reaches a predetermined number, the codebook $\lambda 2_q = \{\mu x_q, \mu y_q\}$ (q=1, . . . , Q) is output.

The wideband power spectrum calculating unit 343 receives the normalized power spectrum $|Nn[f, w]|^2$ (w=0, 1, . . . , M−1) of the ambient noise, which is output from the power normalizing unit 321 as the Dnb-th feature quantity data, then reads the dictionary $\mu 2_q = \{\mu x_q, \mu y_q\}$ (q=1, . . . , Q) of the codebook from the dictionary memory 342, and obtains the wideband power spectrum $|Nw[f, w]|^2$ (w=0, 1, . . . , 2M−1) from the relationship between the Dnb-th narrowband feature quantity data and the Dwb-th wideband feature quantity data. Specifically, among the Q narrowband centroid vectors $x_q$ (q=1, . . . , Q), the narrowband centroid vector is obtained which is the closest one to the normalized power spectrum $|Nn[f, w]|^2$ (w=0, 1, ..., M−1) of the ambient noise in a predetermined distance scale, and the wideband centroid vector $\mu y_1$ in the closest code vector is output as the wideband power spectrum $|Nw[f, w]|^2$ (w=0, 1, ..., 2M−1).

The wideband masking threshold value calculating unit 344 receives the wideband power spectrum $|Nw[f, w]|^2$ (w=0, 1, ..., 2M−1) which is output from the wideband power spectrum calculating unit 343, and calculates the wideband masking threshold value N_wb_th1[f, w] (w=0, 1, ..., 2M−1), which is the masking threshold value of the ambient noise, for each frequency component.

Figure 11:
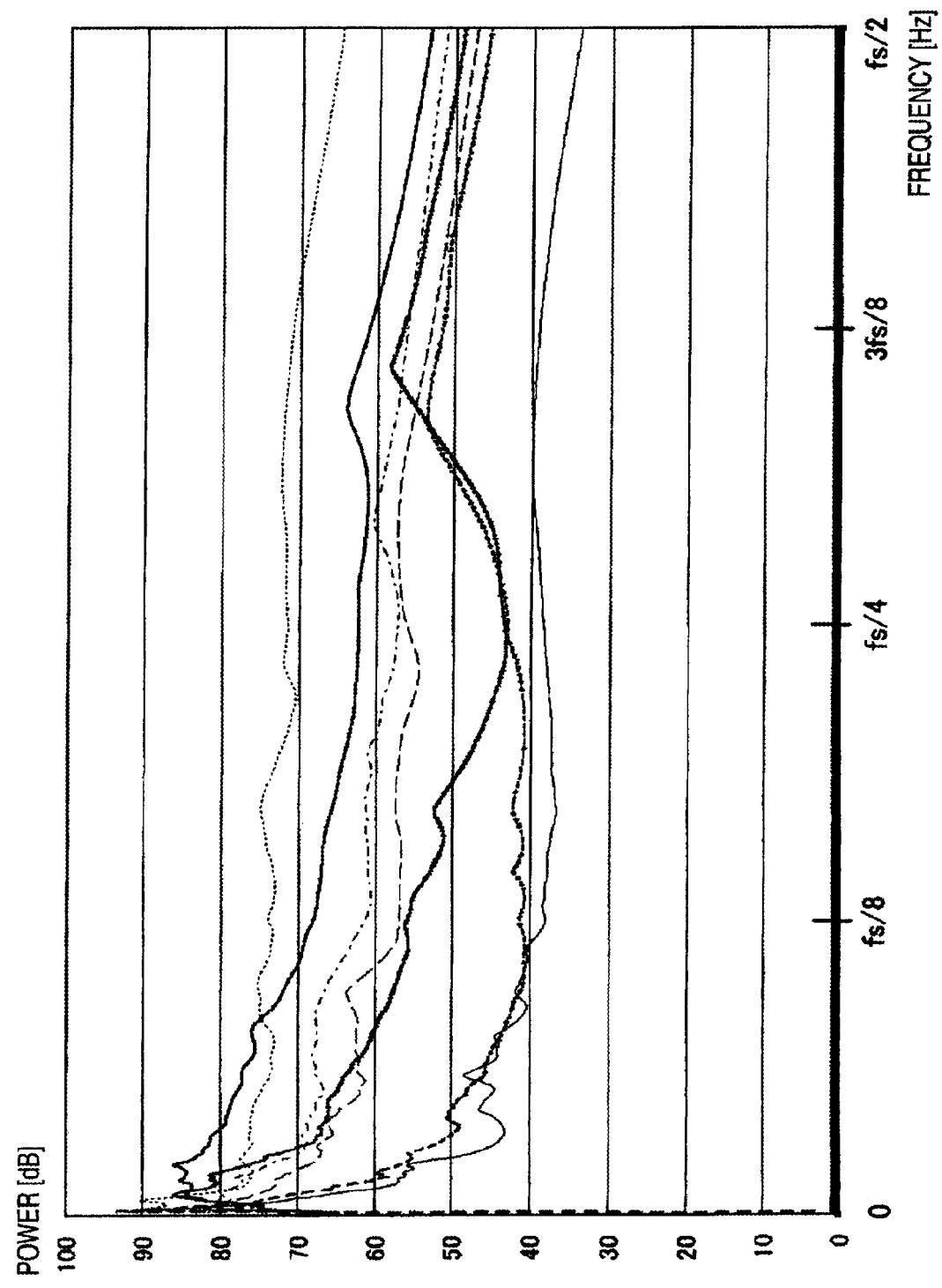
FIG. 11 is a view illustrating an example of a wideband masking threshold value.

In general, the masking threshold value can be calculated by convolving the function (which is called the spreading function) with the power spectrum of the signal. That is, the wideband masking threshold value N_wb_th1[f, w] (w=0, 1, ..., 2M−1) of the ambient noise is calculated by Expression 13 in which the spreading function is denoted as the function sprdngf( ). When equal to or less than the wideband masking threshold value N_wb_th1[f, w], the wideband power spectrum $|Nw[f, w]|^2$ of the ambient noise is masked by the wideband power spectrum of the ambient noise in the frequency band other than the frequency bin ω. FIG. 11 shows an example of the wideband masking threshold values of the ambient noises which are gathered in various environments such as outside, in which the horizontal axis denotes frequency [Hz] and the vertical axis denotes power [dB].

[Expression 13]

$$N\_wb\_th1[f, \omega] = \sum_{j=0}^{2M-1} |N_w[f, j]|^2 \cdot sprdngf(\text{bark}[j], \text{bark}[\omega]) \quad (13)$$

Here, bark[w] represents a bark value which is obtained by transforming the frequency bin ω into the bark scale, and the spreading function is appropriately converted into the bark scale bark [w]. The bark scale is a scale which is set taking into consideration the resolution of auditory perception, such that, as the band is lower, the power scale is made finer, and as the band is higher, the power scale is made rougher.

Here, the spreading function is denoted as the sprdngf( ), and a scheme which is defined in accordance with ISO/IEC13818-7 is used. As the spreading function, other schemes may be employed, for example, the scheme described in a document of ITU-R1387, 3GPPTS 26.403. Further, even without the power scale, the spreading function may be appropriately used which uses a scale obtained from the characteristics of the human's perception, such as, the mel scale, or the ERB scale, obtained from the characteristics of human's perception or the scale obtained from an auditory filter.

The power controller 345 receives the narrowband power value Pow_N[f], which is output from the power normalizing unit 321, and the wideband masking threshold value N_wb_th1[f, w] (w=0, 1, ..., 2M−1) which is output from the wideband masking threshold value calculating unit 344. The power controller 345 controls the wideband masking threshold value N_wb_th1[f, w] so as to be amplified or to be reduced such that the power of the wideband masking threshold value N_wb_th1[f, w] ranging from fs_nb_low [Hz] to fs_nb_high [Hz] becomes equal to the narrowband power value Pow_N[f]. Then, the value N_wb_th1[f, w], which is controlled by the power, is output as the wideband masking threshold value N_wb_th[f, w].

As described above, in the ambient noise information bandwidth extending unit 34, the wideband masking threshold value N_wb_th[f, w], which is the wideband signal information, is obtained from the power spectrum $|N[f, w]|^2$ of the ambient noise which is the narrowband signal information.

Figure 12:
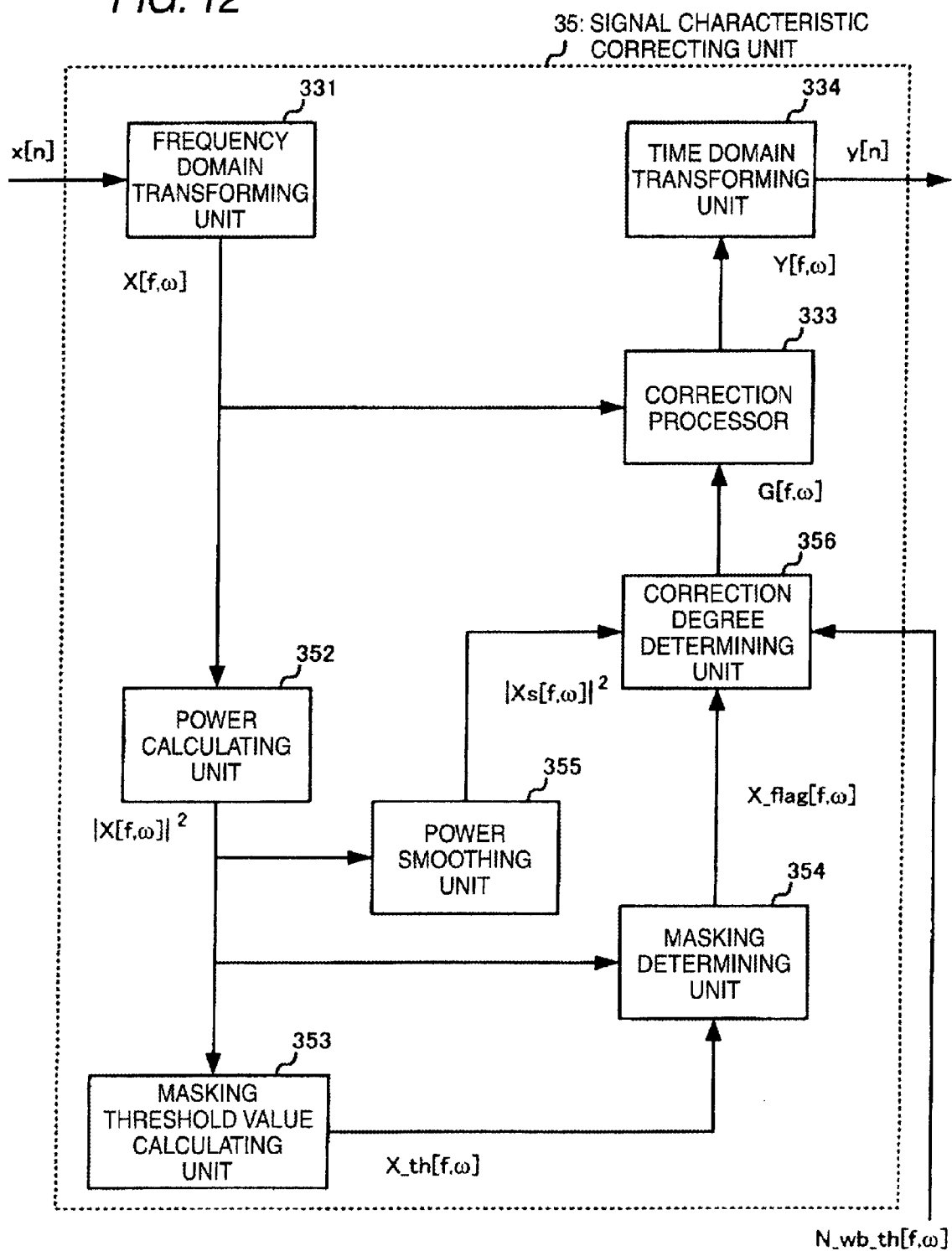
FIG. 12 is a circuit block diagram illustrating an exemplary configuration of a signal characteristics correcting unit of the signal processor shown in FIG. 8.

FIG. 12 shows an exemplary configuration of the signal characteristic correcting unit 35. The signal characteristic correcting unit 35 is provided with a frequency domain transforming unit 331, a power calculating unit 352, a masking threshold value calculating unit 353, a masking determining unit 354, a power smoothing unit 355, a correction degree determining unit 356, a correction processor 333, and a time domain transforming unit 334.

The signal characteristic correcting unit 35 receives the input signal x[n] (n=0, 1, ..., 2N−1) and the wideband masking threshold value N_wb_th[f, w]. The signal characteristic correcting unit 35 performs a signal correcting process with which the input signal x[n] is clarified so as not to be mixed with the ambient noise included in the collection signal, and outputs the corrected output signal y[n] (n=0, 1, ..., 2N−1).

A power calculating unit 352 calculates and outputs the power spectrum $|X[f, w]|^2$ (w=0, 1, ..., 2M−1) which is the square sum of the real part and the imaginary part in the frequency spectrum X[f, w] (w=0, 1, ..., 2M−1) of the input signal x[n] which is output from the frequency domain transforming unit 331.

The masking threshold value calculating unit 353 receives the power spectrum $|X[f, w]|^2$ (w=0, 1, ..., 2M−1) of the input signal x[n] which is output from the power calculating unit 352, denoting the spreading function as sprdngf( ), and using Expression 14 to calculate and output the wideband masking threshold value X_th[f, w] (w=0, 1, ..., 2M−1) of the input signal x[n]. If the power spectrum $|X[f, w]|^2$ is equal to or less than the wideband masking threshold value X_th[f, w] of the input signal x[n], it represents that the wideband masking threshold value X_th[f, w] is masked by the power spectrum $|X[f, w]|^2$ of the input signal x[n] in the frequency band other than the frequency bin ω.

[Expression 14]

$$X\_th[f, \omega] = \sum_{j=0}^{2M-1} |X[f, j]|^2 \cdot sprdngf(\text{bark}[j], \text{bark}[\omega]) \quad (14)$$

The masking determining unit 354 receives the power spectrum $|X[f, w]|^2$ (w=0, 1, ..., 2M−1), which is output from the power calculating unit 352, and the wideband masking threshold value X_th[f, w] which is output from the masking threshold value calculating unit 353, and outputs the masking determination information X_flag[f, w] (w=0, 1, ..., 2M−1) which represents whether or not masking is performed by the input signal x[n] itself in each frequency band. Specifically, the magnitude of the power spectrum $|X[f, w]|^2$ is compared with that of the wideband masking threshold value X_th[f, w]. When the power spectrum $|X[f, w]|^2$ is greater than the wideband masking threshold value X_th[f, w], the frequency band component thereof is not masked by other frequency components in the input signal x[n] and X_flag[f, w] is set to 0. In addition, when the power spectrum $|X[f, w]|^2$ is less than the wideband masking threshold value X_th[f, w], the frequency band thereof is masked by other frequency components in the input signal x[n] and X_flag[f, w] is set to 1.

The power smoothing unit 355 receives the power spectrum $|X[f, w]|^2$ (w=0, 1, ..., 2M−1), which is output from the power calculating unit 352, and the masking determination information X_flag[f, w], which is output from the masking determining unit 354. The power smoothing unit 355 smoothes the power spectrum $|X[f, w]|^2$ by using a moving average with a triangle window as shown in Expression 15, and outputs the smoothened power spectrum $|X_S[f, w]|^2$. Further, K is in a range which the smoothing is calculated, and $\alpha_x[j]$ is a smoothing coefficient which increases as j becomes closer to 0. For example, when K is 3, $\alpha_x[j]$ becomes [0.1, 0.2, 0.4, 0.8, 0.4, 0.2, 0.1]

[Expression 15]

$$|X_S[f, \omega]|^2 = \frac{\sum_{j=-K}^{K} \alpha_X[j] \cdot |X[f, \omega + j]|^2}{\sum_{j=-K}^{K} \alpha_X[j]} \quad (15)$$

The correction degree determining unit 356 receives the smoothened power spectrum $|X_S[f, w]|^2$ (w=0, 1, ..., 2M−1) which is output from the power smoothing unit 355, the masking determination information X_flag[f, w] (w=0, 1, ..., 2M−1) which is output from the masking determining unit 354, and N_wb_th[f, w] (w=0, 1, ..., 2M−1) which is output from the ambient noise information bandwidth extending unit 32. The correction degree determining unit 356 calculates and outputs the correction gain G[f, w] (w=0, 1, ..., 2M−1). Specifically, the correction gain G[f, w] is first calculated such that, when it is determined by the masking determination information X_flag [f, w] that the frequency band is masked by other frequency component in the input signal x[n] (X_flag[f, w]=1), G[f, w] is set to 1, so that neither amplification nor reduction by the correction is performed. Then, for the frequency band which is determined by the masking determination information X_flag [f, w] such that it is not masked (X_flag[f, w]=0) by other frequency components in the input signal x[n], the magnitude of the power spectrum $|X[f, w]|^2$ is compared with that of the wideband masking threshold value N_wb_th[f, w]. Here, when the power spectrum $|X[f, w]|^2$ is greater than the wideband masking threshold value N_wb_th[f, w], since the frequency component is not masked by other frequency components in the collection signal z[n], G[f, w] is set to 1, and the amplification by the correction is not performed. On the other hand, when the power spectrum $|X[f, w]|^2$ is less than the wideband masking threshold value N_wb_th[f, w], it is determined that the masking is performed due to there being ambient noise even though the input signal may be recognized when the ambient noise is less included in the collected signal z[n], and the correction gain G[f, w] is calculated as shown in Expression 16 based on the ratio of the wideband masking threshold value N_wb_th[f, w] of the ambient noise to the smoothened power spectrum $|X_S[f, w]|^2$. Further, the threshold value F is a function in which the slope of the spectrum of the smoothened power spectrum $|X_S[f, w]|^2$ is amplified so as to be closer to and parallel with the wideband masking threshold value N_wb_th[f, w] of the ambient noise. Here, $\alpha$ and $\beta$ are positive integers, and $\gamma$ is a positive or negative integer. These integers are used to adjust the amplification degree of the input signal x[n].

[Expression 16]

$$G[f, \omega] = F\left(\frac{N\_wb\_th[f, \omega]}{|X_S[f, \omega]|^2}\right) \quad (16)$$

[Expression 17]

$$F(x) = \alpha \cdot A^{\beta x + \gamma} \quad (17)$$

In the correction degree determining unit 356, the correction gain G[f, w] obtained as described above is smoothened by using the moving average with the triangle window as shown in Expression 18, and thus the smoothened correction gain $G_S[f, w]$ may be used. Further, K is in a range which the smoothing is calculated, and $\alpha_G[j]$ is a smoothing coefficient which increases as j becomes closer to 0. For example, when K is 3, $\alpha_G[j]$ becomes [0.1, 0.2, 0.4, 0.8, 0.4, 0.2, 0.1]

[Expression 18]

$$G_S[f, \omega] = \frac{\sum_{j=-K}^{K} \alpha_G[j] \cdot G[f, \omega]}{\sum_{j=-K}^{K} \alpha_G[j]} \quad (18)$$

As described above, in the input signal and the collection signal which are reproduced, even though the frequency band in which the signal component exists is different or even though the sampling frequency is different, the bandwidth of the power spectrum as the frequency characteristic of the collection signal is extended by taking into consideration the frequency band of the input signal to estimate the power spectrum. Therefore, the frequency characteristic of the collection signal is calculated with high accuracy, and the intelligibility of the input signal can be improved.

Further, in the case where this modified example is applied to the speech bandwidth extending communication apparatus shown in FIG. 7(b), when a frequency band which is lower than the frequency f_limit (here, f_limit is about 500 to 1200 [Hz], for example, f_limit is assumed to 1000 [Hz]) set in advance in the signal bandwidth extension processor 12 is extended, that is, when fs_wb_low<fs_nb_low and fs_wb_low<f_limit are satisfied, the signal characteristic correcting unit 35 does not perform the signal correcting process on the frequency band lower than f_limit. In the low frequency band (frequency equal to or less than f_limit), deviation in the ambient noise is increased due to the environment when the sound is collected or the type of the noise component. Therefore, it is possible to prevent the signal correcting process from being unstable due to the deviation of the ambient noise in the low frequency band which is extended by the signal bandwidth extension processor 12.

(Second Modified Example of Signal Processor)

In this modified example, a case will be described in which narrowband signal information used in the signal processor 30 shown in FIG. 8 is assumed to be the power spectrum of the ambient noise and the wideband signal information is assumed to be the wideband power spectrum of the ambient noise (the power spectrum when the ambient noise is extended to a wideband signal). In this case, the ambient noise information bandwidth extending unit 34 receives the power spectrum of the ambient noise which is the narrowband signal information, and calculates the normalized power spectrum of the ambient noise as the narrowband feature quantity data.

The ambient noise information bandwidth extending unit 34 calculates the normalized wideband power spectrum of the ambient noise, which is the wideband feature quantity data, using the relationship between the narrowband feature quantity data and the wideband feature quantity data which is obtained through modeling. The ambient noise information bandwidth extending unit 34 generates the wideband power spectrum of the ambient noise, which is the wideband signal information, from the wideband feature quantity data. Further, in the modeling of the relationship between the narrowband feature quantity data and the wideband feature quantity data, a scheme using the GMM shown in FIG. 5 is employed. Therefore, in the input signal and the collection signal which are reproduced, even though the frequency band in which the signal component exists is different or even though the sampling frequency is different, the bandwidth of the power spectrum as the frequency characteristic of the collection signal is extended by taking into consideration the frequency band of the input signal to estimate the power spectrum. Therefore, the frequency characteristic of the collection signal is obtained with high accuracy, and the intelligibility of the input signal can be improved.

(Third Modified Example of Signal Processor)

Next, a case will be described in which the narrowband signal information using the signal processor is assumed to be the power spectrum of the ambient noise and the wideband signal information is the masking threshold value (wideband masking threshold value) which is obtained by extending the ambient noise to a wideband signal.

Figure 13:
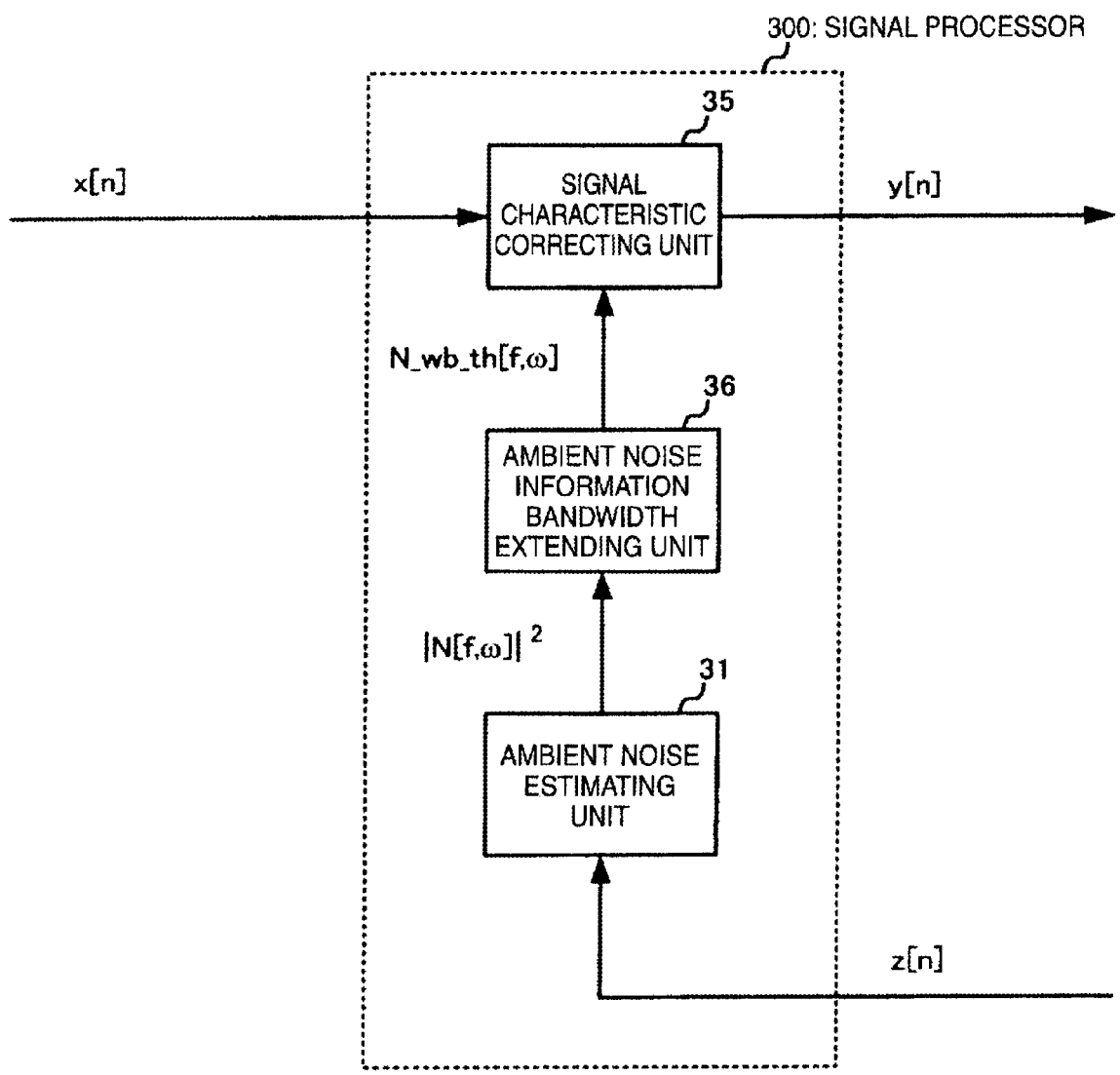
FIG. 13 is an exemplary circuit block diagram illustrating a configuration of a signal processor according to a third modified example of the invention.

FIG. 13 is a view illustrating a configuration of the signal processor. The signal processor 300 is configured to use the ambient noise information bandwidth extending unit 36 instead of the ambient noise information bandwidth extending unit 34 used in the signal processor 30.

Figure 14:
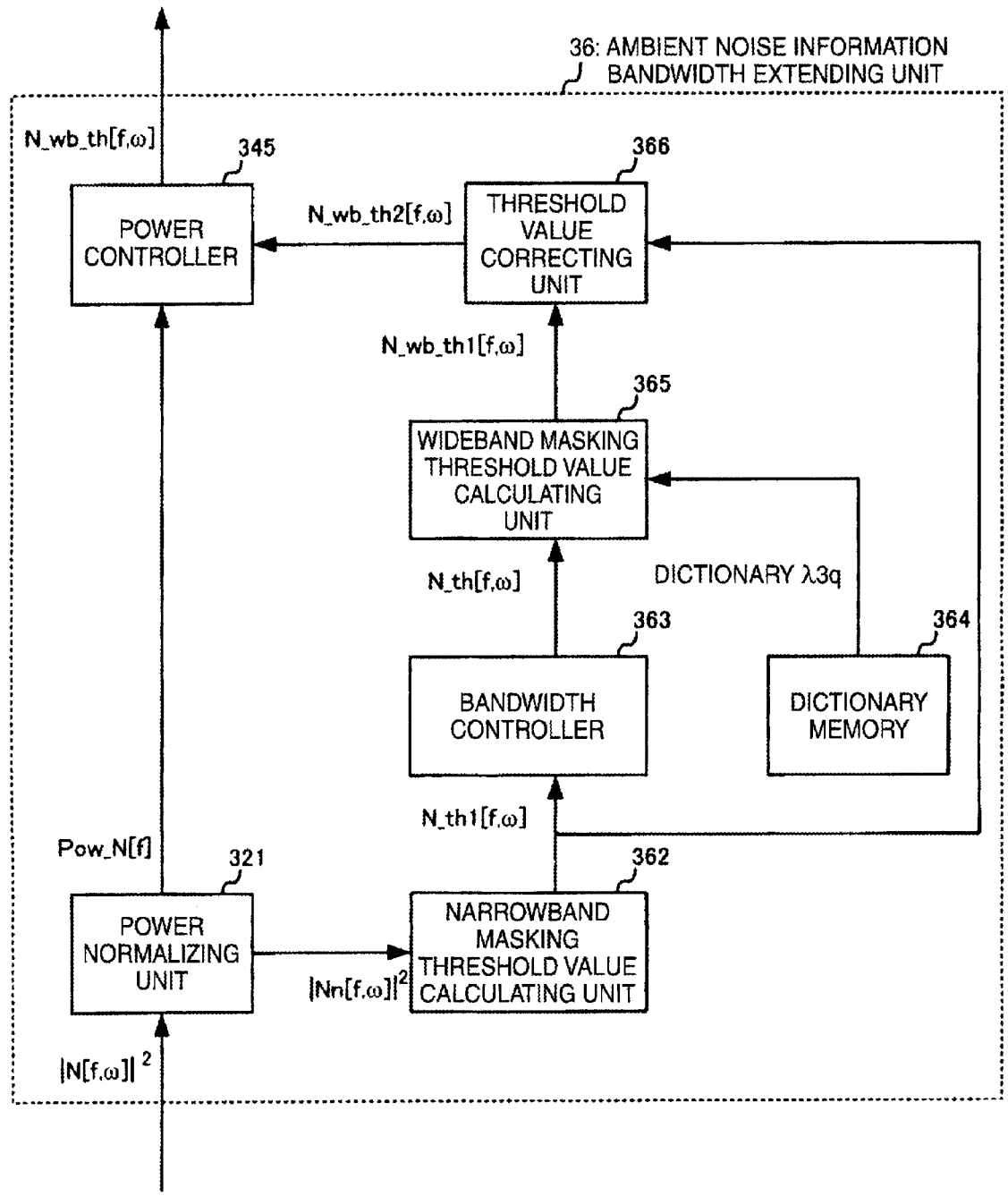
FIG. 14 is a circuit block diagram illustrating an exemplary configuration of an ambient noise information bandwidth extending unit of the signal processor shown in FIG. 13.

FIG. 14 shows an exemplary configuration of the ambient noise information bandwidth extending unit 36. The ambient noise information bandwidth extending unit 36 is provided with the power normalizing unit 321, a narrowband masking threshold value calculating unit 362, a bandwidth controller 363, a dictionary memory 364, a wideband masking threshold value calculating unit 365, a threshold value correcting unit 366, and the power controller 345.

Similar to the ambient noise information bandwidth extending unit 34, the ambient noise information bandwidth extending unit 36 receives the information (narrowband signal information) of the frequency band component of the collection signal z[n], and generates the information (wideband signal information) including the frequency band component which exists in the input signal x[n] but not in the collection signal z[n]. That is, the ambient noise information bandwidth extending unit 36 calculates the narrowband feature quantity data from the narrowband signal information. The ambient noise information bandwidth extending unit 36 prepares in advance the relationship between the narrowband feature quantity data and the wideband feature quantity data through modeling, and calculates the wideband feature quantity data using the relationship with the narrowband feature quantity data which is obtained through modeling, and then generates the wideband signal information from the wideband feature quantity data. In this case, the ambient noise information bandwidth extending unit 36 employs a scheme using a codebook with vector quantization to perform modeling of the relationship between the narrowband feature quantity data and the wideband feature quantity data. Here, there is used the Dnb-th narrowband feature quantity data of the narrowband masking threshold value N_th1[f, w] (w=0, 1, ..., $M_C$-1) in which the ambient noise is limited in a band, and the Dwb-th wideband feature quantity data of the wideband masking threshold value N_wb_th1[f, w] (w=0, 1, ..., 2M-1) of the ambient noise (Dnb=$M_C$, Dwb=2M). Specifically, the ambient noise information bandwidth extending unit 36 receives the power spectrum |N[f, w]|² (w=0, 1, ..., M-1) of the ambient noise, calculates the masking threshold value of the ambient noise, limits band of the masking threshold value, generates the frequency band component which exist in the input signal x[n] but not in the collection signal z[n] by the frequency band extension on the masking threshold value limited in the band, and outputs the wideband masking threshold value N_wb_th[f, w] (w=0, 1, ..., 2M-1) which is the masking threshold value with extended bandwidth.

The narrowband masking threshold value calculating unit 362 receives the normalized power spectrum |Nn[f, w]|² (w=0, 1, ..., M-1) of the ambient noise, which is output from the power normalizing unit 321, and calculates the narrowband masking threshold value N_th1[f, w] (w=0, 1, ..., M-1) which is the masking threshold value of the ambient noise, for each frequency component. Similar to the wideband masking threshold value calculating unit 344 described above, the data length of 2M is replaced with M, and the narrowband masking threshold value N_th1[f, w] (w=0, 1, ..., M-1) of the ambient noise is calculated by Expression 19 in which the spreading function is denoted as the function sprdngf( ). When the normalized power spectrum |Nn[f, w]|² of the ambient noise is equal to or less than the narrowband masking threshold value N_th1[f, w], it represents that the narrowband masking threshold value N_th1[f, w] is masked by the normalized power spectrum of the ambient noise in the frequency band other than the frequency bin ω.

[Expression 19]

$$N\_th1[f, \omega] = \sum_{j=0}^{M-1} |N_n[f, j]|^2 \cdot sprdngf(\text{bark}[j], \text{bark}[\omega]) \tag{19}$$

The bandwidth controller 363 receives the narrowband masking threshold value N_th1[f, w] (w=0, 1, ..., M-1) of the ambient noise which is output from the narrowband masking threshold value calculating unit 362, performs control such that the signal information is used only in the frequency band ranging from the lower limit frequency limit_low [Hz] controlled in the bandwidth to the upper limit frequency limit_high [Hz] controlled in the bandwidth, and outputs the narrowband masking threshold value N_th[f, w] controlled in the bandwidth. In this case, fs_nb_low≤limit_low<limit_high≤fs_nb_high<fs/2 is satisfied. For example, when it is assumed that limit_low=1000 [Hz] and limit_high=3400 [Hz], only the narrowband masking threshold values of w=32, 33, ..., 108 are used among the narrowband masking threshold value N_th1[f, w] (w=0, 1, ..., M-1) taking into consideration the frequency bands of the above-mentioned vales transformed to the frequency bin ω by considering that Hertz ([Hz]) is the unit of a value multiplied fs by ω/2M. $M_C$ is set to the number of arrays of N_th[f, w], and the narrowband masking threshold value N_th1[f, w] (w=32, ..., 108) is substituted for the narrowband masking threshold value N_th[f, w] (w=0, 1, ..., $M_C$-1) controlled in the bandwidth. In this case, $M_C$ is set to 77 (=108-32+1).

As shown in FIG. 11, it can be seen that the variance and the deviation in the masking threshold value of the ambient noise in the low frequency band are increased due to the environment when the sound is collected or the type of the noise component. Since the main component of the ambient noise is the noise component, the variance and the deviation of the narrowband masking threshold value N_th1[f, w] are also increased in the low frequency band. Therefore, in order to obtain the wideband masking threshold value with high accuracy employing the scheme using the codebook with vector quantization to perform modeling of the relationship between the narrowband feature quantity data and the wideband feature quantity data, the bandwidth is controlled so as not to use the low frequency band in which the variation and the deviation are large. That is, in this case, the lower limit frequency limit_low [Hz] controlled in the bandwidth is preferably set to the lower limit of the frequency band in which the variance and the deviation of the narrowband masking threshold value becomes smaller than a predetermined value. As a result, the wideband masking threshold value can be obtained with high accuracy, and the intelligibility of the input signal can be improved.

In addition, the masking threshold value is calculated taking into consideration the power spectrum of the peripheral frequency band as well as the power spectrum of the frequency band. Therefore, the masking threshold value cannot be accurately calculated in the vicinity of the frequency band with limited bandwidth of the original signal of which the masking threshold value is obtained. That is, in this case, the upper limit frequency limit_high [Hz] controlled in the bandwidth is preferably set to the upper limit of the frequency band in which the masking threshold value is obtained with accuracy even though the band limitation is taken into consideration. As a result, the wideband masking threshold value can be obtained with high accuracy, and the intelligibility of the input signal can be improved.

The dictionary memory 364 stores the dictionary $\lambda 3_q = \{\mu x_q, \mu y_q\}$ (q=1, ..., Q) of the codebook with a size Q (here, Q=64) which is previously learned through modeling of the relationship between the Dnb-th narrowband feature quantity data and the Dwb-th wideband feature quantity data. Further, $\mu x_q$ represents a centroid vector of the narrowband feature quantity data in the q-th codebook, and $\mu y_q$ represents a centroid vector of the wideband feature quantity data of the q-th codebook. Further, the dimension of the code vector of the codebook is the sum (Dnb+Dwb) of the components of the centroid vector $\mu x_q$ of the narrowband signal information and the centroid vector $\mu y_q$ of the wideband signal information.

Figure 15:
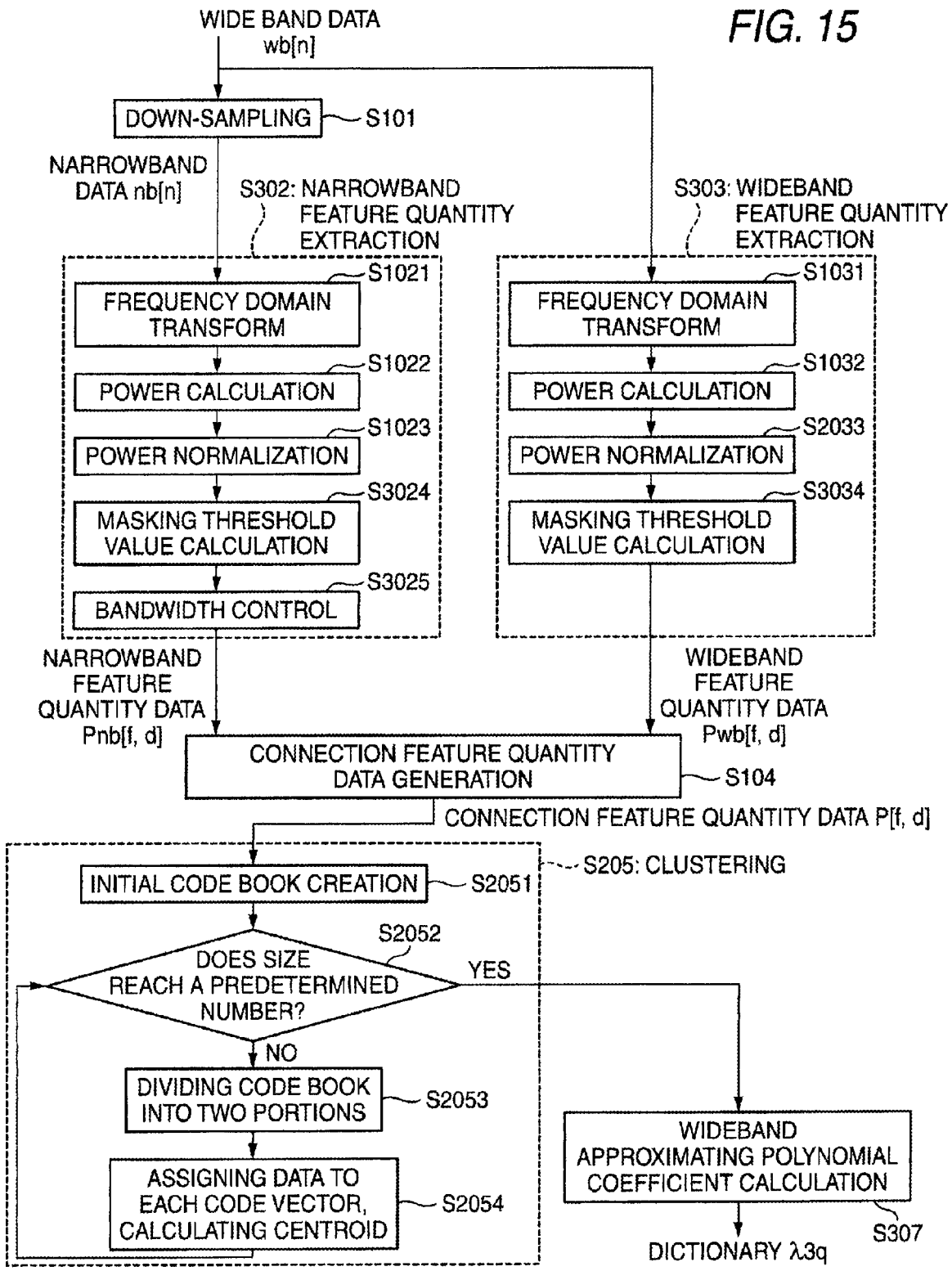
FIG. 15 is a flowchart illustrating a method of generating a dictionary in a dictionary memory of the ambient noise information bandwidth extending unit shown in FIG. 14.

An example of the method of previously learning and generating the dictionary $\lambda 3_q$ in the dictionary memory 364 will be described with reference to FIG. 15 showing a flowchart. In the following descriptions, the same processes as those of the method of learning and generating the dictionary $\lambda 2_q$ described in the first modified example are designated by the same reference numerals, and for simple and clear description, the description already given will be omitted as needed.

First, the wideband signal data wb[n] is input, and is downsampled at the sampling frequency fs [Hz], so that the narrowband signal data nb[n] is obtained (step S101). Then, the narrowband feature quantity data Pnb[f, d] (d=1, ..., Dnb), which is the feature quantity data representing the narrowband signal information, is extracted from the narrowband signal data nb[n] (step S202). In step S202, the power spectrum (M-th) of the narrowband signal data nb[n] is obtained (step S1021), the power value of the narrowband signal data nb[n] is obtained (step S1022), the normalized power spectrum of the narrowband signal data nb[n] is obtained (step S1023), and the masking threshold value of the narrowband signal data nb[n] is calculated similar to Expression 19 (step S3024). Then, the masking threshold value of the narrowband signal data nb[n] is controlled in the bandwidth similar to the process performed by the bandwidth controller 363 (step S3025). The narrowband feature quantity data is extracted by outputting the normalized power spectrum as the narrowband feature quantity data Pnb[f, d] (d=1, ..., Dnb) of the Dnb-th (=$M_C$) order.

On the other hand, the wideband feature quantity data Pwb[f, d] (d=1, ..., Dwb), which is the feature quantity data representing the wideband signal information, is extracted from the wideband signal data wb[n] (step S303). In step S303, the power spectrum (2M-th) of the wideband signal data wb[n] is obtained (step S1031), the power value of the wideband signal data wb[n] is obtained from the wideband signal data wb[n] (step S2032), the normalized power spectrum of the wideband signal data wb[n] is obtained from the power spectrum and the power value in frame units (step S2033), and the masking threshold value of the wideband signal data wb[n] is calculated similar to Expression 23 by setting the order from M to 2M (step S3034). The extraction of the wideband feature quantity data is performed by outputting the normalized power spectrum as the wideband feature quantity data Pwb[f, d] (d=1, ..., Dwb) of the Dwb (=2M) order. Next, the narrowband feature quantity data Pnb[f, d] (d=1, ..., Dnb) and the wideband feature quantity data Pwb[f, d] (d=1, ..., Dwb) are connected, so that the connection feature quantity data P[f, d] (d=1, ..., Dnb+Dwb) of the Dnb+Dwb order is generated (step S104).

The narrowband centroid vector $\mu x_q$ and the wideband centroid vector $\mu y_q$ in each code vector of the codebook are obtained from the connection feature quantity data P [f, d], and the codebook with a size Q (here, Q=64) is generated using a scheme where clustering is performed by the k-means algorithm or the LBG algorithm (step S205). The masking threshold value of the wideband signal data wb[n] which is the wideband centroid vector $\mu y_q$ in each code vector of the codebook is expressed by an approximating polynomial coefficient, the approximating polynomial coefficient is stored in the dictionary as the wideband centroid vector $\mu' y_q$ and the dictionary $\lambda 3_q = \{\mu x_q, \mu' y_q\}$ (q=1, ..., Q) is generated (step S307). Here, as shown in Expression 20, the approximating polynomial coefficient $m_p$ (p=0, ..., P) is a coefficient of the polynomial which is obtained such that the masking threshold value is approximated by a polynomial of a predetermined order (here, which means P, for example, P=6) in a coordinate system of which the vertical axis denotes the power value X [dB] and the horizontal axis denotes the frequency Y [Hz], which will be referred to as this in the following.

[Expression 20]

$$Y \cong \sum_{i=0}^{P} m_i \cdot X^i = m_0 + m_1 X + m_2 X^2 + \ldots + m_P X^P \quad (20)$$

As described above, the masking threshold value is expressed by the approximating polynomial coefficient and stored as the dictionary, so that the memory capacity required for storing the dictionary can be reduced in comparison with the case where the masking threshold value is stored as the dictionary. Since the number of arrays of the dictionary is small, the amount of throughput required for using the dictionary can be reduced.

The wideband masking threshold value calculating unit 365 receives the narrowband masking threshold value N_th[f, w] (w=0, 1, ..., $M_C$−1), as the Dnb-th feature amount data, with limited bandwidth which is output from the bandwidth controller 363, reads the dictionary $\lambda 3_q = \{\mu x_q, \mu \lambda y_q\}$ (q=

1, ..., Q) of the codebook from the dictionary memory 364, and obtains the wideband masking threshold value N_wb_th1[f, w] (w=0, 1, ..., 2M−1) of the ambient noise from the relationship between the Dnb-th narrowband feature quantity data and the Dwb-th wideband feature quantity data. Specifically, among the Q narrowband centroid vectors $\mu x_q$ (q=1, ..., Q), the narrowband centroid vector is obtained which is the closest one to the narrowband masking threshold value N_th[f, w] (w=0, 1, ..., $M_C$−1) with limited bandwidth in a predetermined distance scale, the wideband centroid vector $\mu' y_q$ in the closest code vector is set without being changed as the approximating polynomial coefficient of the wideband masking threshold value, and the wideband power spectrum N_wb_th1[f, w] (w=0, 1, ... 2M−1) is calculated similar to Expression 20.

The threshold value correction unit 366 receives the narrowband masking threshold value N_th1[f, w] (w=0, 1, ..., M−1) of the ambient noise, which is output from the narrowband masking threshold value calculating unit 362, and the wideband masking threshold value N_wb_th1[f, w] (w=0, 1, ..., 2M−1) of the ambient noise which is output from the wideband masking threshold value calculating unit 365, performs a correction such that the discontinuity or the differential discontinuity in the vicinity of the boundary band between the narrowband and the wideband is removed, and outputs the corrected wideband masking threshold value N_wb_th2[f, w] (w=0, 1, ..., 2M−1).

Figure 16A:
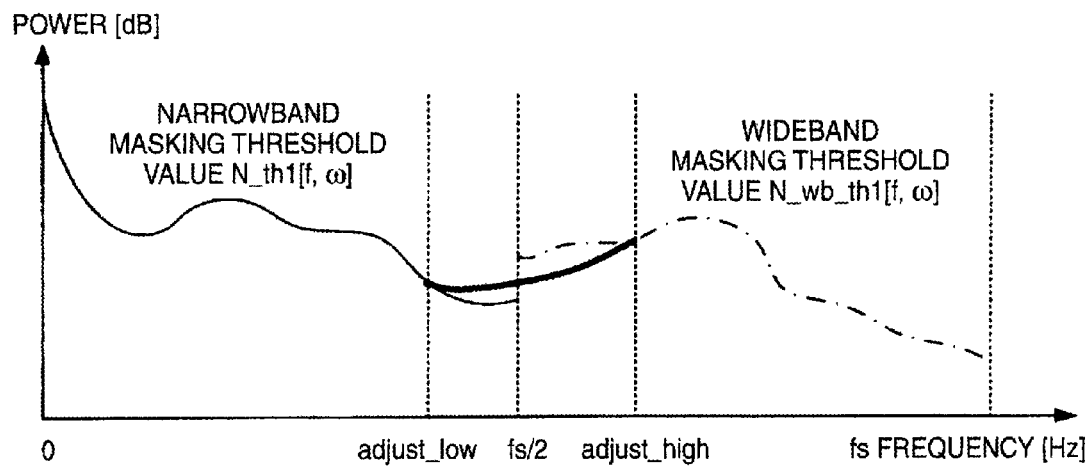
FIGS. 16A and 16B are views illustrating examples of operations of a threshold value correcting unit of the ambient noise information bandwidth extending unit shown in FIG. 14.
Figure 16B:
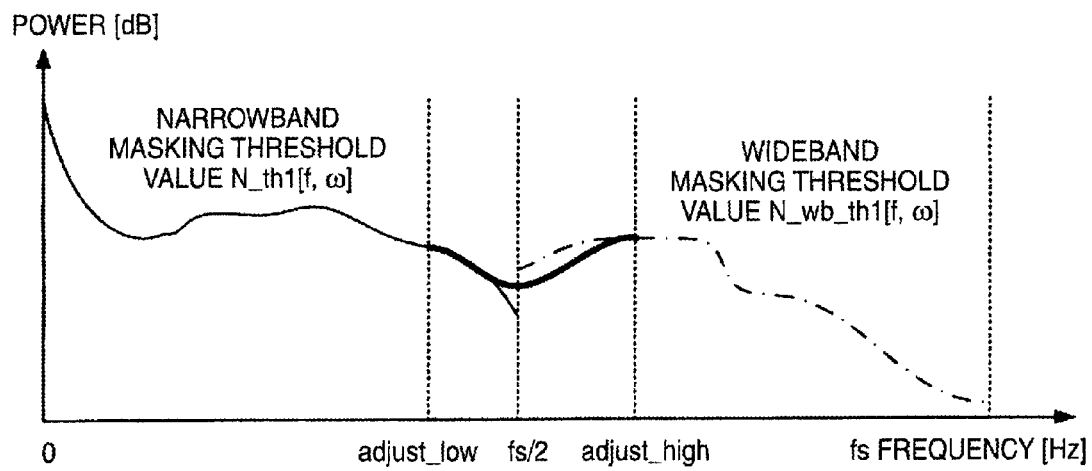

FIG. 16A shows an example of the wideband masking threshold value N_wb_th2[f, w] which is corrected to remove the discontinuity generated between the narrowband masking threshold value N_th[f, w] and the wideband masking threshold value N_wb_th1[f, w] in the frequencies before and after the boundary band fs/2 [Hz]. FIG. 16B shows an example of the wideband masking threshold value N_wb_th2[f, w] which is corrected to remove both the discontinuity and the differential discontinuity generated between the narrowband masking threshold value N_th[f, w] and the wideband masking threshold value N_wb_th1[f, w] in the frequencies before and after the boundary band fs/2 [Hz]. In both drawings, the solid line denotes the narrowband masking threshold value N_th[f, w], the broken line denotes the wideband masking threshold value N_wb_th2[f, w], and the bold solid line denotes the corrected place in the corrected wideband masking threshold value N_wb_th2[f, w]. In this case, it is assumed that adjust_low [Hz]<fs/2<adjust_high [Hz]. Here, adjust_low is larger than the frequency corresponding to the frequency bin $\omega_L$−1 and is less than the frequency corresponding to the frequency bin $\omega_L$, and adjust_high is larger than the frequency corresponding to the frequency bin $\omega_H$, and less than the frequency corresponding to the frequency bin $\omega_H$+1. For example, when fs=8000 [Hz], adjust_low is assumed to 3600 [Hz] and adjust_high is assumed to 4400 [Hz]. Specifically, when the discontinuity or the differential discontinuity are detected in at least the frequencies before and after the boundary band fs/2 [Hz], for the vicinity of the boundary band ranging from adjust_low [Hz] to adjust_high [Hz], the wideband masking threshold value of the frequency bin ranging from $\omega_L$+S+1 to $\omega_H$−S−1 is simulated by the (2S−1)th function using the wideband masking threshold value N_wb_th1[f, w] in the frequency bins $\omega_L$, $\omega_L$+1, ..., $\omega_L$+S and $\omega_H$−1, ..., $\omega_H$−S, and is subjected to the spline interpolation, and thus the corrected wideband masking threshold value N_wb_th2[f, w] is obtained. Here, the spline interpolation may be performed by setting the simulating function to pass through the center point of the narrowband masking threshold value N_th1[f, M−1] and the wideband masking threshold value N_wb_th1[f, M].

As described above, the wideband masking threshold value is corrected in the threshold value correcting unit 366, so that the discontinuity or the differential discontinuity is removed in the wideband masking threshold value. In addition, there is also no discontinuity in the frequency direction in terms of the signal correction. Therefore, the signal can be corrected so as to be a natural signal with no sense of discomfort. The high intelligibility can be obtained.

As described above, in the input signal and the collection signal which are reproduced, even though the frequency band in which the signal component exists is different or even though the sampling frequency is different, the masking threshold value of the collection signal is extended by taking into consideration the frequency band of the input signal to estimate the masking threshold value. Therefore, the masking threshold value of the collection signal is obtained with high accuracy, and the intelligibility of the input signal can be improved.

(Fourth Modified Example of Signal Processor)

Figure 17:
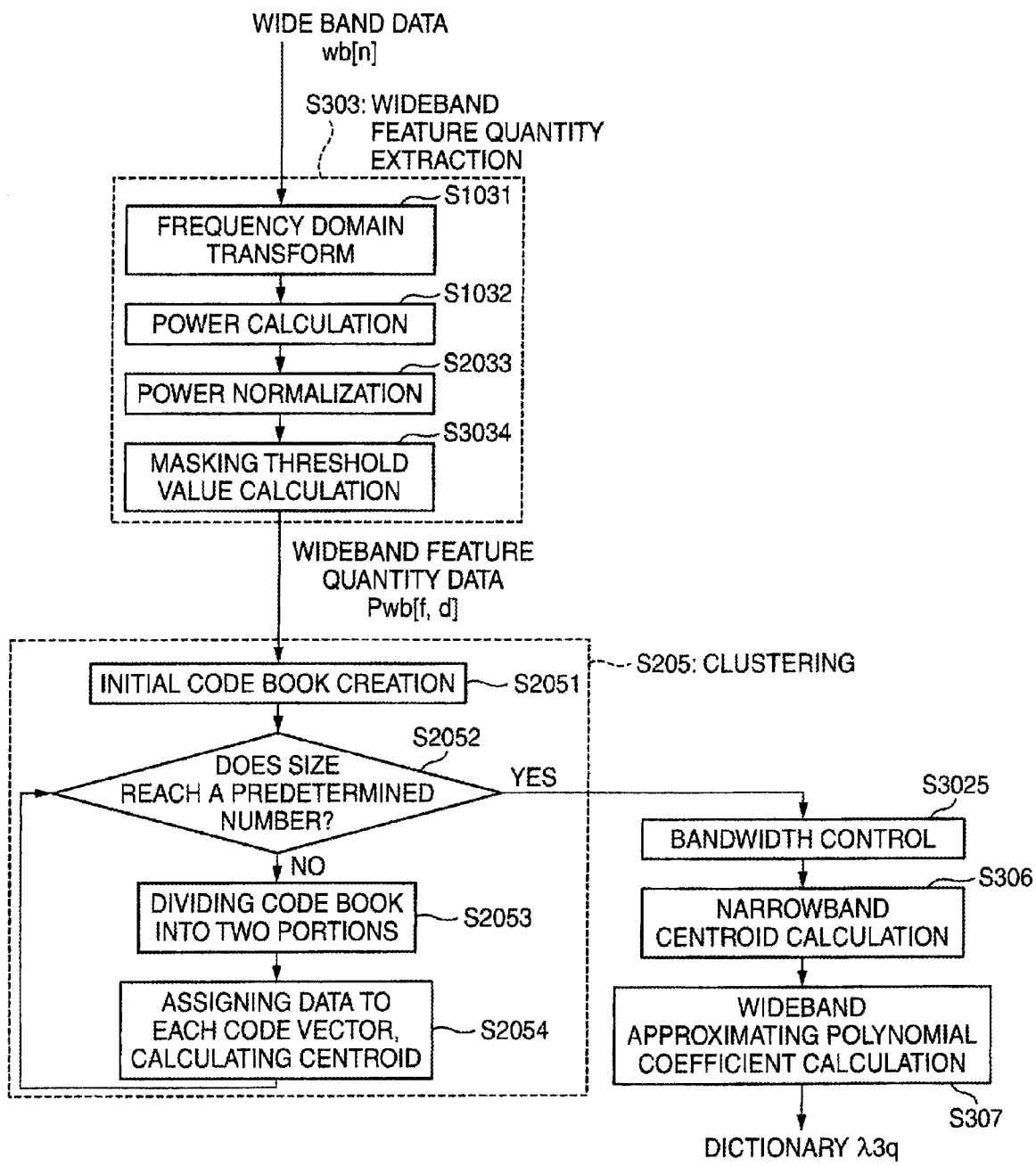
FIG. 17 is an exemplary flowchart illustrating another method of generating a dictionary in the dictionary memory of the ambient noise information bandwidth extending unit shown in FIG. 14.

Another example of the method of previously learning and generating the dictionary $\lambda 3_q$ in the dictionary memory 364 of the signal processor 300 will be described with reference to FIG. 17 showing a flowchart. Here, the method of previously learning and generating the dictionary $\lambda 3_q$ will be described from only the wideband signal data wb[n] without generating the narrowband signal data nb[n]. In the following descriptions, the same processes as those of the method of learning and generating the dictionary $\lambda 3_q$ described in the second modified example are designated by the same reference numerals, and for simple and clear description, the description already given will be omitted as needed.

First, in step S303, the wideband feature quantity data Pwb[f, d] (d=1, ..., Dwb) which is the feature quantity data (here, which is the masking threshold value) representing the wideband signal information is extracted from the wideband signal data wb[n]. In step S205, the codebook with a size Q is created using only the wideband feature quantity data Pwb[f, d] (d=1, ..., Dwb). Then, the wideband masking threshold value of the wideband signal data wb[n] which is the wideband centroid vector $\mu y_q$ in each code vector of the codebook is controlled to use only the wideband masking threshold value of the frequency band with limited bandwidth ranging from the lower limit frequency limit_low [Hz] to the upper limit frequency limit_high [Hz] (step S3025). By this, the narrowband masking threshold value limited in the narrowband is obtained to be output as the narrowband centroid vector $\mu x_q$ (q=1, ..., Q) in each code vector of the codebook (step S306). Thereafter, in step S307, the narrowband centroid vector is stored in the dictionary together with the wideband centroid vector $\mu' y_q$ which is the approximating polynomial coefficient of the masking threshold value of the wideband signal data wb[n] calculated in step S307 so as to generate the dictionary $\lambda 3_q = \{\mu x_q, \mu' y_q\}$.

In the scheme shown in FIG. 15 in which the narrowband feature quantity data is used together in clustering, an error in the vicinity of the boundary band between the narrowband and the wideband is included in the narrowband feature quantity data. As described above, the clustering is performed using only the wideband feature quantity data, the wideband centroid vector is limited in the band, and the narrowband centroid vector is obtained, so that the clustering is performed using only the wideband feature quantity data of the ideal data. Therefore, it is possible to perform the clustering with higher accuracy in comparison with the scheme shown in FIG. 15.

(Fifth Modified Example of Signal Processor)

Another example of the method of previously learning and generating the dictionary $\lambda 3_q$ in the dictionary memory 364 of the signal processor 300 will be described with reference to FIG. 18 showing a flowchart. In the following descriptions, the same processes as those of the method of learning and generating the dictionary $\lambda 3_q$ described in the second modified example are designated by the same reference numerals, and for simple and clear description, the description already given will be omitted as needed.

In step S205, the codebook with a size Q is created. Then, the masking threshold value of the narrowband signal data nb[n] which is the narrowband centroid vector $\mu x_q$ in each code vector of the codebook is expressed by the approximating polynomial function as shown in Expression 20, and is output as the narrowband centroid vector $\mu' x_q$ (q=1, ..., Q) (step S306A). Thereafter, in step S307, the narrowband centroid vector is stored in the dictionary together with the wideband centroid vector $\mu' y_q$ which is the approximating polynomial coefficient of the masking threshold value of the wideband signal data wb[n] calculated in step S307 so as to generate the dictionary $\lambda 3_q = \{\mu' x_q, \mu' y_q\}$.

On the other hand, in this scheme, the wideband masking threshold value calculating unit 365 receives the narrowband masking threshold value N_th[f, w] (w=0, 1, ..., $M_C$−1) with limited bandwidth which is output from the bandwidth controller 363 as the Dnb-th feature quantity data, reads the dictionary $\lambda 3_q = \{\mu' x_q, \mu' y_q\}$ (q=1, ..., Q) of the codebook from the dictionary memory 364, and obtains the wideband masking threshold value N_wb_th1[f, w] (w=0, 1, ..., 2M−1) of the ambient noise from the relationship between the Dnb-th narrowband feature quantity data and the Dwb-th wideband feature quantity data. Specifically, with the approximating polynomial function of the Q narrowband centroid vectors $\mu' x_q$ (q=1, ..., Q), the narrowband centroid vector is substituted for the approximating polynomial function to obtain the closest one to the narrowband masking threshold value N_th[f, w] (w=0, 1, ..., $M_C$−1) with limited bandwidth in a predetermined distance scale, the wideband centroid vector $\mu' y_q$ in the closest code vector is set without being changed as the approximating polynomial coefficient of the wideband masking threshold value, and the wideband centroid vector N_wb_th1[f, w] (w=0, 1, ..., 2M−1) is calculated similar to Expression 20.

As described above, the narrowband masking threshold value is also expressed by the approximating polynomial coefficient stored as the dictionary, so that the memory capacity required for storing the dictionary can be reduced in comparison with the case where the masking threshold value is stored as the dictionary or with the scheme shown in FIG. 15. Since the number of arrays of the dictionary is small, the amount of throughput required for using the dictionary can be reduced.

Second Embodiment

Figure 19A:
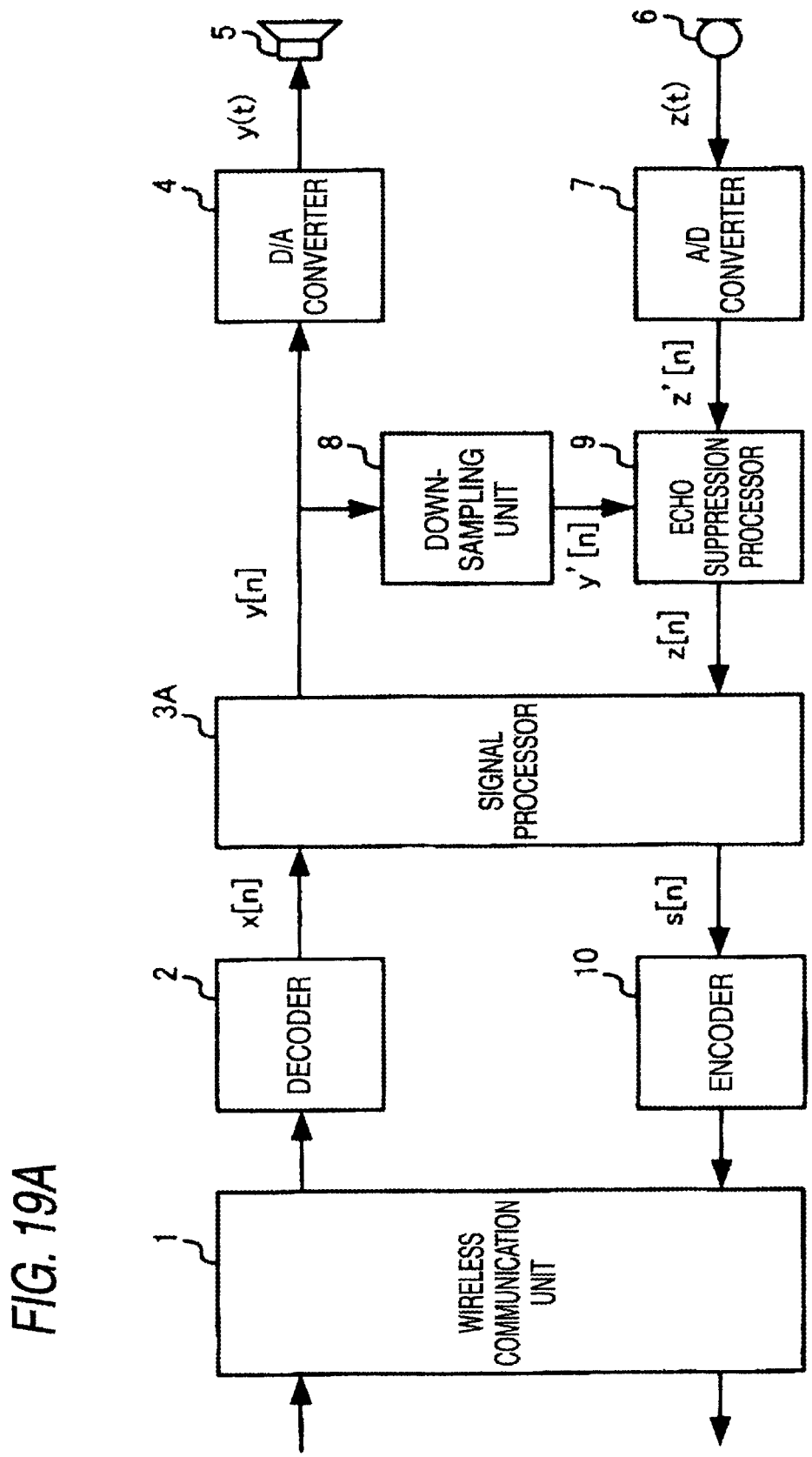
FIGS. 19A to 19C are exemplary circuit block diagrams illustrating a configuration of a communication apparatus and a digital audio player to which a signal processor according to a second embodiment of the invention is applied.

FIG. 19A shows a configuration of the communication apparatus according to a second embodiment of the invention.

The communication apparatus shown in the drawing shows the reception system of the wireless communication apparatus such as a mobile telephone, which is provided with the wireless communication unit 1, the decoder 2, the signal processor 3A, the digital/analog (D/A) converter 4, the speaker 5, the microphone 6, the analog/digital (A/D) converter 7, the down-sampling unit 8, the echo suppression processor 9, and the encoder 10.

Figure 19B:
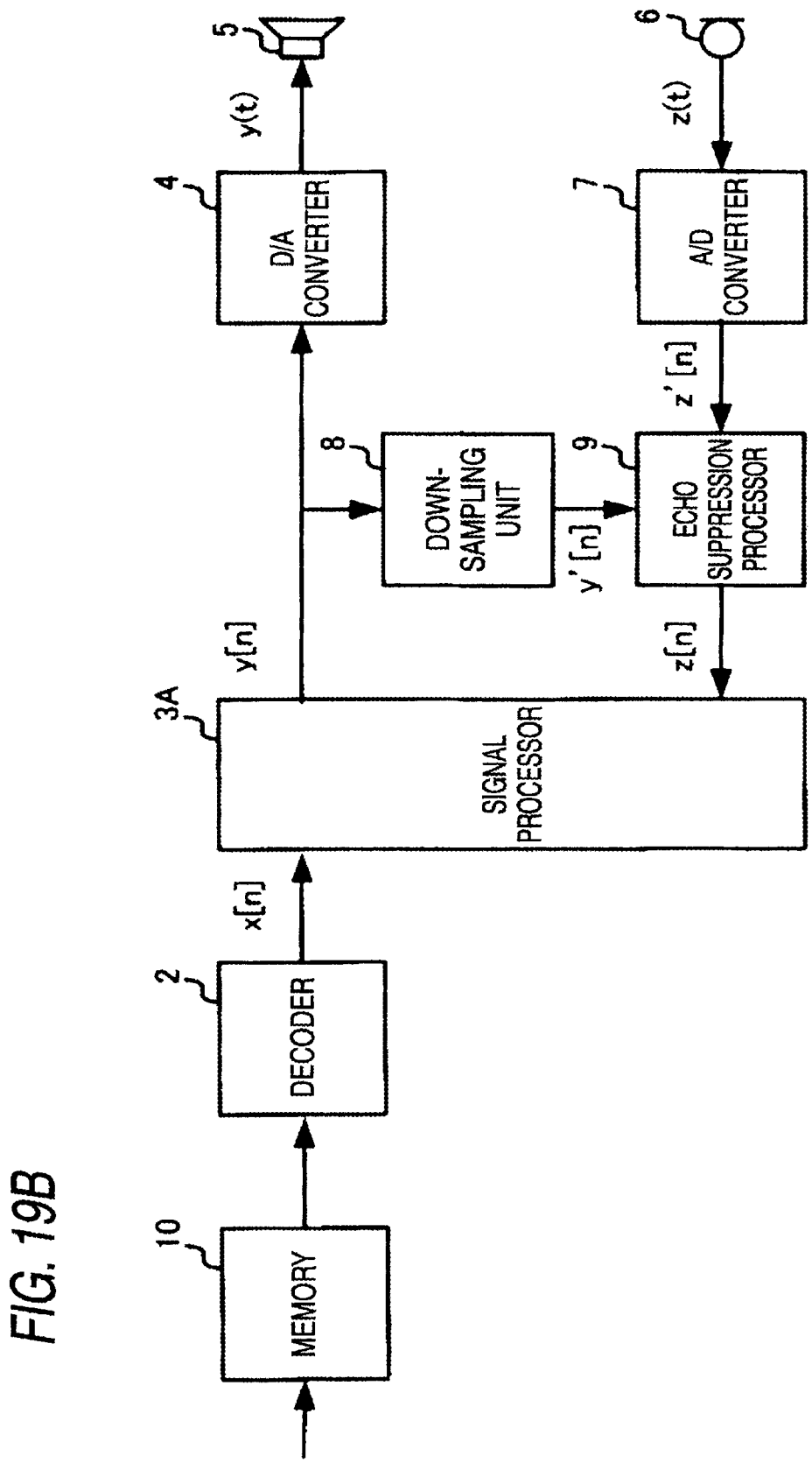
Figure 19C:
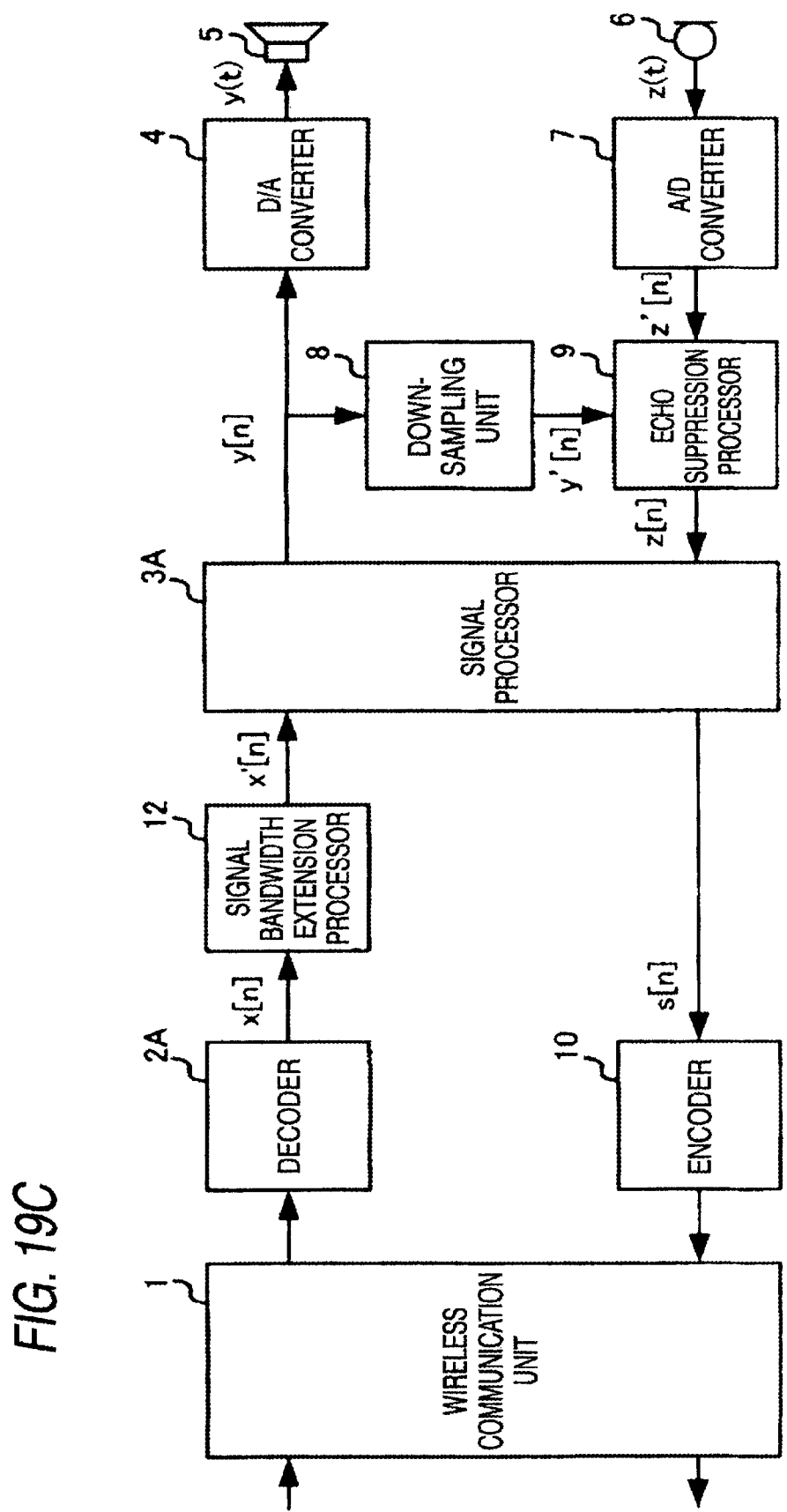

Further, similar to the first embodiment, the invention can also be applied to the digital audio player shown in FIG. 19B as well as the communication apparatus shown in FIG. 19A. In addition, the invention can also be applied to the speech bandwidth extending communication apparatus shown in FIG. 19 C.

Figure 20:
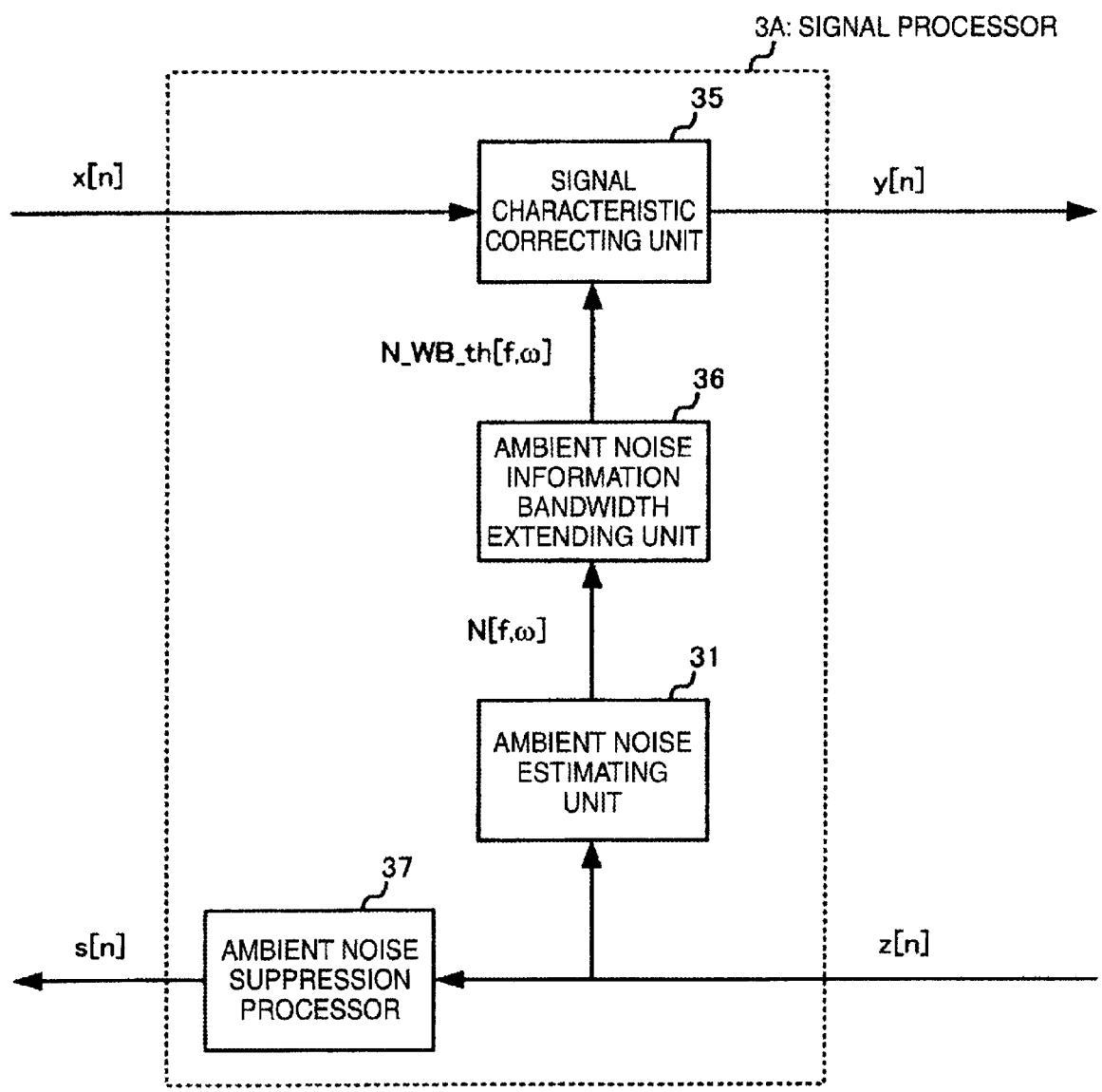
FIG. 20 is an exemplary circuit block diagram illustrating a configuration of the signal processor according to the second embodiment of the invention.

Next, the signal processor 3A will be described. FIG. 20 shows the configuration. The signal processor 3A is configured of an ambient noise suppression processor 37 in addition to those of the signal processor 3 described in the first embodiment. In the following descriptions, the same components as those of the above-mentioned embodiment are designated by the same reference numerals, and the description already given will be omitted as needed.

Figure 21:
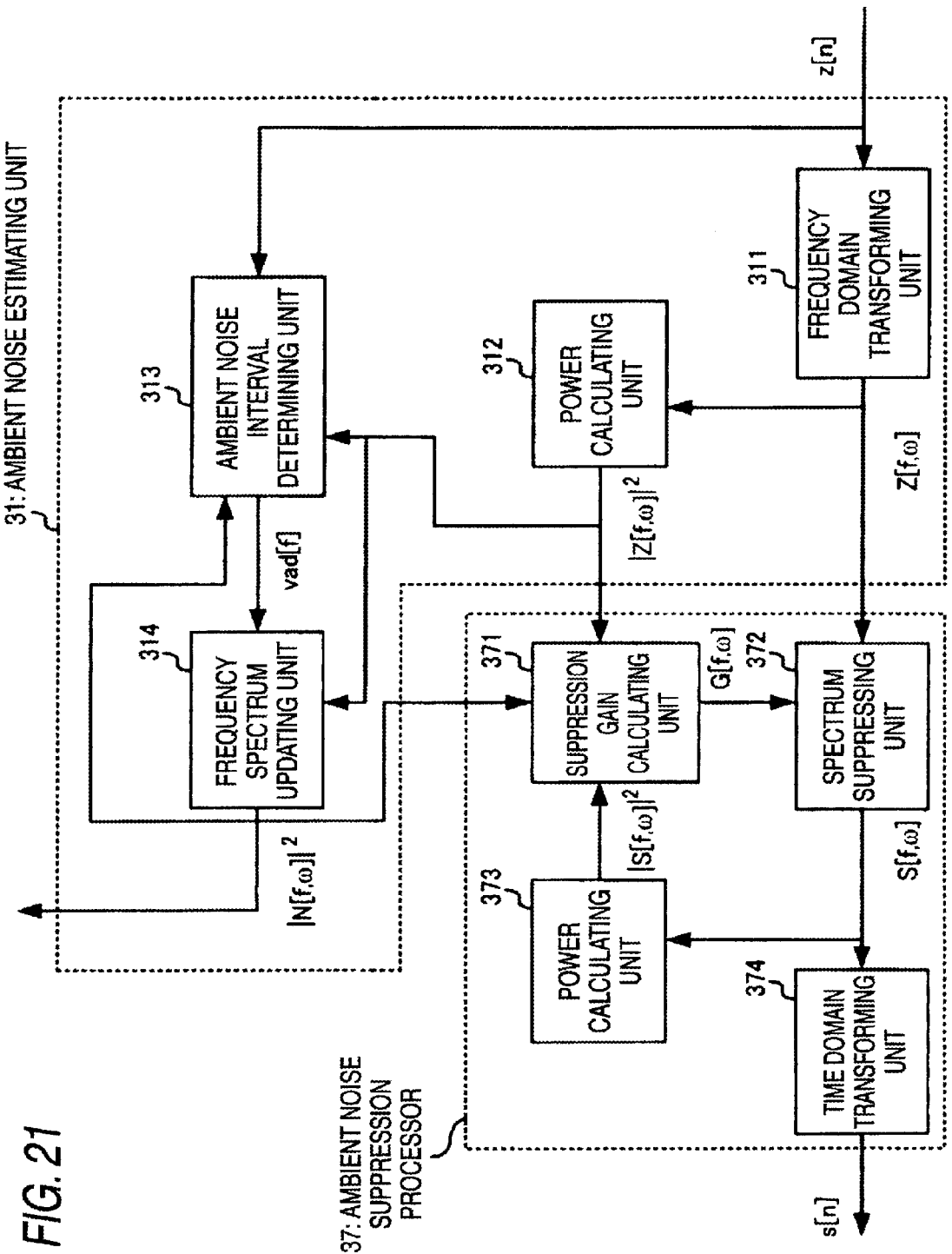
FIG. 21 is a circuit block diagram illustrating an exemplary configuration of an ambient noise estimating unit and an ambient noise suppression processor of the signal processor shown in FIG. 20.

FIG. 21 shows an exemplary configuration of the ambient noise suppression processor 37. The ambient noise suppression processor 37 is provided with a suppression gain calculating unit 371, a spectrum suppressing unit 372, a power calculating unit 373, and a time domain transforming unit 374.

The ambient noise suppression processor 37 suppresses the noise component, which is the ambient noise included in the collection signal z[n], using the power spectrum of the ambient noise output from the ambient noise estimating unit 31, the power spectrum of the collection signal z[n], and the frequency spectrum of the collection signal z[n]. The signal s[n] is suppressed in the noise component which is the ambient noise, and is output to the encoder 10. The encoder 10 encodes the signal s[n] which is output from the ambient noise suppression processor 37, and output the encoded signal to the wireless communication unit 1.

The suppression gain calculating-unit 371 outputs the suppression gain G[f, w] (w=0, 1, ..., M−1) of each frequency band using the power spectrum $|Z[f, w]|^2$ (w=0, 1, ..., M−1) of the collection signal z[n] output from the power calculating unit 312, the power spectrum $|N[f, w]|^2$ (w=0, 1, ..., M−1) of the ambient noise output from the frequency spectrum updating unit 314, and the power spectrum $|S[f−1, w]|^2$ (w=0, 1, ..., M−1) of the signal which is subjected to the suppression in the previous one frame and is output from the power calculating unit 373. For example, the suppression gain G [f, w] is calculated by the following algorithms or a composition thereof. That is, as a general noise canceller, there are the suppression gain G[f, w] is assumed to be calculated using a spectral subtraction method (S. F. Boll, "Suppression of acoustic noise in speech using spectral subtraction", IEEE Trans. Acoustics, Speech, and Signal Processing, vol. ASSP-29, pp. 113-120, 1979.), a wiener filter method (J. S. Lim, A. V. Oppenheim, "Enhancement and bandwidth compression of noise speech", Proc. IEEE Vol. 67, No. 12, pp. 1586-1604, December 1979.), a maximum likelihood method (R. J. McAulay, M, L. Malpass, "Speech enhancement using a soft-decision noise suppression filter", IEEE Trans. On Acoustics, Speech, and Signal Processing, vol. ASSP-28, no. 2, pp. 137-145, April 1980.), and the like. Here, the wiener filter method as an example is used to calculate the suppression gain G[f, w].

The spectrum suppressing unit 372 receives the frequency spectrum Z[f, w] of the collection signal z[n] which is output from the frequency band transforming unit 311 and a suppression gain G[f, w] which is output from the suppression gain calculating unit 371, divides the frequency spectrum Z[f, w] of the collection signal z[n] into the amplitude spectrum $|Z[f, w]|^2$ (w=0, 1, ..., M−1) of the collection signal z[n] and the phase spectrum z[f, w] (w=0, 1, ..., M−1), suppresses the noise component which is the ambient noise by multiplying the suppression gain G[f, w] by the amplitude spectrum |Z[f, w]| of the collection signal z[n], and calculates the frequency spectrum S[f, w] (w=0, 1, . . . , M−1) of the signal subjected to the suppression by setting the amplitude spectrum to |S[f−1, w]| and by setting the phase spectrum $\theta_z[f, w]$ without being changed to the phase spectrum $\theta_s[f, w]$ of the signal subjected to the suppression.

The power calculating unit 373 calculates and outputs the power spectrum $|S[f, w]|^2$ (w=0, 1, . . . , M−1) of the signal subjected to the suppression from the frequency spectrum S[f, w] (w=0, 1, . . . , M−1) of the signal subjected to the suppression which is output from the spectrum suppressing unit 372.

The time domain transforming unit 374 receives the frequency spectrum S[f, w] (w=0, 1, . . . , M−1) of the signal subjected to the suppression which is output from the spectrum suppressing unit 372, and performs a process (for example, IFFT) for transforming the frequency domain into the time domain. Taking into consideration the overlapping in the windowing in the frequency domain transforming unit 311, the time domain transforming unit 374 adds the signal s[n] subjected to the suppression in the previous one frame to calculate the signal s[n] (n=0, 1, . . . , N−1) of the time domain which is subjected to the suppression.

As described above, by using the ambient noise suppressing process together with the ambient noise estimating process, an increase in the amount of throughput is suppressed and the input signal is clarified. At the same time, it is possible to obtain the collection signal with a high speech quality by suppressing the ambient noise component in the collection signal.

Further, the invention is not limited to the embodiments described above, but various changes can be implemented in the constituent components without departing from the scope of the invention. In addition, the plural constituent components disclosed in the embodiments can be appropriately put into practice in combination with each other, so that various inventions can be implemented. In addition, for example, it can also be considered the configuration in which some components are removed from the entire constituent components shown in the embodiments. Furthermore, the constituent components described in other embodiments may be appropriately combined.

For example, the sampling frequency of the input signal (or the target signal) is not limited to the frequency which is larger 2 times than the sampling frequency of the collection signal (or the ambient noise), but may be an integral multiple or a non-integral multiple of the sampling frequency of the collection signal. In addition, the sampling frequency of the input signal (or the target signal) is equal to the sampling frequency of the collection signal (or the ambient noise), and the limitation range of the frequency band of the input signal (or the target signal) may also be different from the limitation range of the frequency band of the collection signal (or the ambient noise). The limitation range of the frequency band of the input signal (or the target signal) may also be different from the limitation range of the frequency band of the collection signal (or the ambient noise). Further, the limitation range of the frequency range of the input signal (or the target signal) may not include the limitation range of the frequency band of the collection signal (or the ambient noise). Furthermore, the limitation range of the frequency band of the input signal (or the target signal) may not adjacent to the limitation range of the frequency band of the collection signal (or the ambient noise).

In addition, even though the input signal is a monaural signal or a stereo signal, the signal process of the signal processor 3 is performed on an L (left) channel and an R (right) channel, or the signal process described above is performed on the sum signal (the sum of the signals of the L channel and the R channel) and the subtraction signal (the subtraction of the signals of the L channel and the R channel), for example. Therefore, the same effect can be obtained. Of course, even though the input signal is the multichannel signal, the signal process described above is similarly performed on the respective channel signals, for example, and thus the same effect can be obtained.

Besides, it is matter of course that even when various changes are made in the invention without departing from the gist of the invention, it can be similarly implemented.

What is claimed is:

1. A signal processing apparatus configured to change volume level or frequency characteristics of an input signal with a limited bandwidth in a first frequency range, the apparatus comprising:
   a processor which includes an information extracting unit, a frequency characteristic information extending unit, and a signal correcting unit, and is configured to:
      extract second frequency characteristic information from a collection signal with a limited bandwidth in a second frequency range different from the first frequency range;
   estimate first frequency characteristic information from the extracted second frequency characteristic information, the first frequency characteristic information including the first frequency range; and
   change the volume level or the frequency characteristics of the input signal according to the obtained first frequency characteristic information.

2. The signal processing apparatus according to claim 1, wherein the processor is further configured to extract frequency characteristic information with a limited bandwidth in a third frequency range narrower than the second frequency range.

3. The signal processing apparatus according to claim 1, further comprising:
   a memory configured to store a relationship between frequency characteristic information on the second frequency range and frequency characteristic information on the first frequency range of a signal acquired in advance,
   wherein the processor is configured to estimate the first frequency characteristic information using the relationship stored in the memory.

4. The signal processing apparatus according to claim 1, wherein the processor is configured to estimate the first frequency characteristic information by performing correction such that continuity or differential continuity is obtained in a frequency band included in the first frequency range.

5. The signal processing apparatus according to claim 1, wherein the processor is further configured to extract a masking level in each frequency.

6. The signal processing apparatus according to claim 5, wherein the masking level in each frequency is expressed by an approximating polynomial.

7. A signal processing apparatus comprising:
   a processor which includes an extending unit, an information extracting unit, a frequency characteristic information extending unit, and a signal correcting unit, and is configured to:
      extend a bandwidth of an input signal limited to a first frequency range, to a third frequency range different from the first frequency range;

extract first frequency characteristic information from a collection signal collected and limited in band in a second frequency range different from the third frequency range;

estimate second frequency characteristic information from the extracted first frequency characteristic information, the second frequency characteristic information including the third frequency range; and change volume level or frequency characteristics of the input signal extended to the third frequency range according to the obtained second frequency characteristic information and the third frequency range.

8. A signal processing method for changing volume level or frequency characteristics of an input signal with a limited bandwidth in a first frequency range, the method comprising:

extracting second frequency characteristic information from a collection signal with a limited bandwidth in a second frequency range different from the first frequency range;

estimating first frequency characteristic information from the extracted second frequency characteristic information, the first frequency characteristic information including the first frequency range; and changing the volume level or the frequency characteristics of the input signal according to the obtained first frequency characteristic information.

9. A signal processing method comprising:

extending a bandwidth of an input signal limited to a first frequency range, to a third frequency range different from the first frequency range;

extracting first frequency characteristic information from a collection signal collected and limited in band in a second frequency range different from the third frequency range;

estimating second frequency characteristic information from the extracted first frequency characteristic information, the second frequency characteristic information including the third frequency range; and changing volume level or frequency characteristics of the input signal extended to the third frequency range according to the obtained second frequency characteristic information and the third frequency range.

* * * * *